United States Patent
Murakami et al.

(10) Patent No.: US 8,603,708 B2
(45) Date of Patent: Dec. 10, 2013

(54) DYE-CONTAINING NEGATIVE CURABLE COMPOSITION, COLOR FILTER USING SAME, METHOD OF PRODUCING COLOR FILTER, AND SOLID-STATE IMAGING DEVICE

(75) Inventors: Yousuke Murakami, Haibara-gun (JP); Shinichi Kanna, Haibara-gun (JP); Kazuhiro Fujimaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 262 days.

(21) Appl. No.: 13/062,281

(22) PCT Filed: Sep. 25, 2009

(86) PCT No.: PCT/JP2009/066646
§ 371 (c)(1),
(2), (4) Date: Mar. 30, 2011

(87) PCT Pub. No.: WO2010/038675
PCT Pub. Date: Apr. 8, 2010

(65) Prior Publication Data
US 2011/0189598 A1   Aug. 4, 2011

(30) Foreign Application Priority Data
Sep. 30, 2008   (JP) .................... 2008-252601

(51) Int. Cl.
*G02B 5/20* (2006.01)

(52) U.S. Cl.
USPC ............................... 430/7; 430/270.1

(58) Field of Classification Search
None
See application file for complete search history.

(56) References Cited

U.S. PATENT DOCUMENTS

| | | | |
|---|---|---|---|
| 4,632,897 A | 12/1986 | Barzynski et al. | |
| 5,914,206 A | 6/1999 | Takasaki et al. | |
| 2008/0206660 A1 | 8/2008 | Takakuwa et al. | |

FOREIGN PATENT DOCUMENTS

| | | |
|---|---|---|
| EP | 0 927 911 A2 | 7/1999 |
| EP | 0 962 827 A2 | 12/1999 |
| EP | 1 460 478 A1 | 9/2004 |
| JP | 54-63903 A | 5/1979 |
| JP | 58-030748 A | 2/1983 |
| JP | 02-181704 A | 7/1990 |
| JP | 02-199403 A | 8/1990 |
| JP | 05-273411 A | 10/1993 |
| JP | 06-075375 A | 3/1994 |
| JP | 07-140654 A | 6/1995 |
| JP | 10-082908 A | 3/1998 |
| JP | 11-231124 A | 8/1999 |
| JP | 2001-350012 A | 12/2001 |
| JP | 2002-258472 A | 9/2002 |
| JP | 2005-202252 A | 7/2005 |
| JP | 2005274966 A | 10/2005 |
| JP | 2008197285 A | 8/2008 |
| JP | 2008-209765 A | 9/2008 |

OTHER PUBLICATIONS

Computer-generated translation of JP 2002-258472 (Sep. 2002).*
Communication, May 25, 2012, issued in corresponding EP Application No. 09817708.2, 6 pages.
Notice of Reasons for Rejection, dated Jan. 22, 2013, issued in corresponding JP Application No. 2008-252601, 4 pages in English and Japanese.

* cited by examiner

*Primary Examiner* — John A. McPherson
(74) *Attorney, Agent, or Firm* — Sughrue Mion, PLLC

(57) ABSTRACT

The invention provides a dye-containing negative curable composition containing at least: (A) an organic solvent-soluble dye; (B) a photo-polymerization initiator; (C) a photo-polymerizable compound; (D) an amino group-containing alkali-soluble resin having, in a side chain thereof, a structure represented by the following Formula (1); and (E) an organic solvent.

Formula (1)

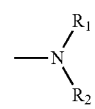

In Formula (1), $R_1$ and $R_2$ each independently represent a hydrogen atom or a monovalent organic group, and $R_1$ and $R_2$ may be linked with each other to form a ring structure.

17 Claims, 1 Drawing Sheet

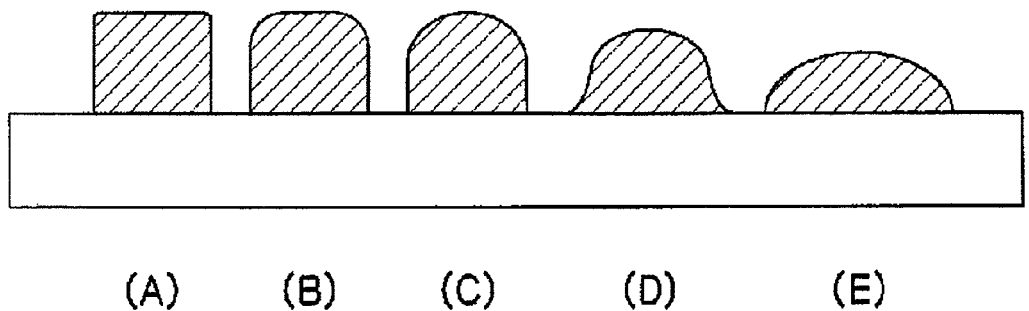
(A)　　(B)　　(C)　　(D)　　(E)

DYE-CONTAINING NEGATIVE CURABLE COMPOSITION, COLOR FILTER USING SAME, METHOD OF PRODUCING COLOR FILTER, AND SOLID-STATE IMAGING DEVICE

CROSS REFERENCE TO RELATED APPLICATIONS

This application is a National Stage of International Application No. PCT/JP2009/066646 filed Sep. 25, 2009, claiming priority based on Japanese Patent Application No. 2008-252601 filed Sep. 30, 2008, the contents of all of which are incorporated herein by reference in their entirety.

TECHNICAL FIELD

The present invention relates to a dye-containing negative curable composition, a color filter using the dye-containing negative curable composition, a method of producing the color filter, and a solid-state image sensor.

RELATED ART

Known methods of producing a color filter used in liquid crystal displays and solid-state image sensors include a dye method, a print method, an electrodeposition method, and a pigment-dispersion method.

Among these, a pigment-dispersion method is a method of producing a color filter by photolithography using a colored radiosensitive composition in which a pigment is dispersed in a photosensitive composition of various kinds This method has the advantage of being stable with respect to light, heat or the like, due to the use of a pigment. Further, since patterning is conducted by photolithography, this method has been widely used as a suitable method for producing a color filter for a large-sized color display with high positional accuracy and high resolution.

In the pigment-dispersion method of producing a color filter, a color filter is obtained by repeating a process for the number of times of colors to be used, the process including forming a coating film by applying a radiosensitive composition onto a glass substrate by a spin-coater or a roll-coater and drying the same, forming colored pixels by exposing the coating film to light in a pattern-wise manner, and developing the exposed coating film.

Examples of the pigment-dispersion method include a method of using a negative photosensitive composition containing an alkali-soluble resin, a photo-polymerizable monomer and a photo-polymerization initiator in combination (for example, see Japanese Patent Application Laid-Open (JP-A) Nos. 2-181704, 2-199403, 5-273411, 7-140654, and 54-63903).

Examples of the pigment-dispersion method further include a method of using a radiation-sensitive composition for producing a color filter, in which the composition contains an alkali-soluble resin, a polyfunctional monomer, a photo-polymerization initiator, and a polyfunctional epoxy composition (a low molecular compound or a high molecular compound) (for example, see JP-A No. 11-231124).

Further examples of the pigment-dispersion method include a method of using a thermally-curable ink composition for producing a color filter, in which the composition contains a pigment, a binder, and an epoxy monomer (for example, see JP-A No. 2001-350012).

In recent years, even higher resolution in color filters used in solid-state image sensors has been desired. However, it is difficult to further improve the resolution in a conventional pigment-dispersion system, and there are problems such as occurrence of color irregularities caused by coarse particles in the pigment. Therefore, a conventional pigment-dispersion system is not suitable for applications in which formation of a fine-sized pattern is required, such as solid-state image sensors.

In view of these problems, a technique of using a dye instead of a pigment has been proposed (for example, see JP-A No. 6-75375).

DISCLOSURE OF THE INVENTION

Subjects to be Addressed by the Invention

However, there has been a demand for color filters used in solid-state image sensors in recent years to have a film thickness of 1 μm or less. In addition, a pixel size of 2 μm or less, higher dye concentration, and higher resolution have been also requested.

It is generally known that the smaller the pixel size is, the more difficult the achievement of high resolution is. When patterns having a pixel size of 2 μm or less are developed by a conventional technique, especially in the case of a Bayer pattern, there have been problems such as remaining of films or residuals after the development. It has also been difficult to obtain patterns having a rectangular shape.

The present invention has been made in view of the above circumstances, and aims to provide a dye-containing negative curable composition that enables to form an excellent pattern shape without forming remaining films and residuals left after development, even with a fine pixel size; a color filter using the composition; a method of producing the color filter; and a solid-state imaging device that exhibits excellent color reproducibility.

Means to Address the Subjects

<1> A dye-containing negative curable composition comprising at least: (A) an organic solvent-soluble dye; (B) a photo-polymerization initiator; (C) a polymerizable compound; (D) an amino group-containing alkali-soluble resin having, in a side chain thereof, a structure represented by the following Formula (1); and (E) an organic solvent:

Formula (1)

wherein in Formula (1), $R_1$ and $R_2$ each independently represent a hydrogen atom or a monovalent organic group, and $R_1$ and $R_2$ may be linked to each other to form a ring structure.

<2> The dye-containing negative curable composition of <1>, wherein (D) the amino group-containing alkali-soluble resin is a polymer compound having a repeating unit represented by the following Formula (2):

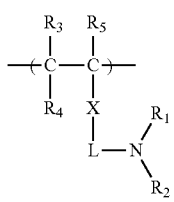

Formula (2)

wherein in Formula (2), $R_1$ and $R_2$ have the same definitions as $R_1$ and $R_2$ in Formula (1); $R_3$, $R_4$ and $R_5$ each independently represent a hydrogen atom or a monovalent organic group; X represents a phenylene group, *—C(=O)—O— or —C(=O)—$NR_6$—, in which $R_6$ represents a hydrogen atom or a monovalent organic group, and * represents a site at which X bonds to the main chain of (D) the amino group-containing alkali-soluble resin; and L represents a single bond or a divalent linking group.

<3> The dye-containing negative curable composition of <1> or <2>, wherein (D) the amino group-containing alkali-soluble resin has a weight-average molecular weight of from 3,000 to 100,000 and an acid value of from 10 mgKOH/g to 200 mgKOH/g.

<4> The dye-containing negative curable composition of any one of <1> to <3>, wherein (D) the amino group-containing alkali-soluble resin has an amino value of from 5 mgKOH/g to 200 mgKOH/g.

<5> The dye-containing negative curable composition of <3> or <4>, wherein (D) the amino group-containing alkali-soluble resin has an acid value of from 30 mgKOH/g to 200 mgKOH/g.

<6> The dye-containing negative curable composition of any one of <1> to <5>, wherein (A) the organic solvent-soluble dye is an acidic dye.

<7> The dye-containing negative curable composition of any one of <1> to <6>, wherein the content of (A) the organic solvent-soluble dye is 40 mass % or more with respect to the total solid component of the dye-containing negative curable composition.

<8> The dye-containing negative curable composition of any one of <1> to <7>, wherein (B) the photo-polymerization initiator is an oxime compound.

<9> The dye-containing negative curable composition of any one of <1> to <8> used for producing a color filter for a solid-state imaging device.

<10> A color filter produced by using the dye-containing negative curable composition of any one of <1> to <9>.

<11> A method of producing a color filter, the method comprising:
applying the dye-containing negative curable composition of any one of <1> to <9> onto a support to form a dye-containing negative curable composition layer; and
forming a pattern on the support by exposing the dye-containing negative curable composition layer to light through a mask and developing the exposed dye-containing negative curable composition layer.

<12> A solid-state imaging device comprising the color filter of <10>.

Effect of the Invention

A dye-containing negative curable composition that enables formation of an excellent pattern shape without forming remaining films and residuals left after development even with a fine pixel size; a color filter using the composition; a method of producing the color filter; and a solid-state imaging device having excellent color reproducibility, may be provided according to the present invention.

BRIEF DESCRIPTION OF THE DRAWINGS

FIG. 1 illustrates the evaluation criteria of pattern profile of a cross section, in which:
(A) is a view showing an excellent rectangular shape;
(B) is a view showing a pattern profile having a slightly rounded corners;
(C) is a view showing a pattern profile having a round top;
(D) is a view showing a pattern profile having a round top and an extended bottom part; and
(E) is a view showing a pattern profile being collapsed to have a completely round top.

MODE OF IMPLEMENTING THE INVENTION

In the following, details of the dye-containing negative curable composition, the color filter using the dye-containing negative curable composition, and the method of producing the same are explained.

Dye-containing Negative Curable Composition

The dye-containing negative curable composition contains at least: (A) an organic solvent-soluble dye; (B) a photo-polymerization initiator; (C) a photo-polymerizable compound; (D) an amino group-containing alkali-soluble resin having, in a side chain thereof, a structure represented by the following Formula (1); and (E) an organic solvent. The composition may further contain other components such as an alkali-soluble binder or a crosslinking agent, as necessary.

The following are details of components of the dye-containing negative curable composition.

(A) Organic Solvent-Soluble Dye

The dye-containing negative curable composition contains at least one kind of an organic solvent-soluble dye.

In the invention, the "organic solvent-soluble dye" encompasses derivatives thereof.

In the invention, the dye that is soluble in an organic solvent is not particularly limited, but may be selected from known dyes that are used in conventional color filters.

It is preferred to use an organic solvent-soluble acidic dye as the dye in the invention, since occurrence of heat sag caused by performing a baking treatment at high temperature after the formation of the pattern can be effectively suppressed, and coatability (uniformity of coated surfaces) can be improved.

Examples of the known dyes include dyes described in JP-A Nos. 64-90403, 64-91102, 1-94301 and 6-11614, JP No. 2592207, U.S. Pat. Nos. 4,808,501, 5,667,920 and 5,059,500, and JP-A Nos. 5-333207, 6-35183, 6-51115 and 6-194828.

Examples of the chemical structure of the organic solvent-soluble dyes that are soluble in an organic solvent include triphenylmethane dyes, anthraquinone dyes, benzylidene dyes, oxonol dyes, cyanine dyes, phenothiazine dyes, pyrazole azo dyes, anilino azo dyes, pyrazolotriazole azo dyes, pyridone azo dyes, pyrrolopyrazole azomethine dyes, xanthene dyes, phthalocyanine dyes, benzopyrane dyes, indigo dyes, and anthrapyridone dyes. Among these, pyrazole azo dyes, anilino azo dyes, pyrazolotriazole azo dyes, pyridone azo dyes, anthraquinone dyes, and anthrapyridone dyes are particularly preferable.

When the dye-containing negative curable composition according to the invention is used for a resist system that can be patterned by developing with water or an alkali developer, binder and/or dye can be completely removed by performing development by using the organic solvent-soluble acidic dye in the composition.

In addition to the organic solvent-soluble acidic dyes as mentioned above, direct dyes, basic dyes, mordant dyes, acid mordant dyes, azoic dyes, dispersive dyes, oil soluble dyes, foodstuff dyes and/or derivatives of these dyes may be used as the organic solvent-soluble dye, as long as the effect of the invention is not impaired thereby.

The organic solvent-soluble acidic dye (hereinafter also referred to as an "acidic dye") are explained hereinafter.

The acidic dye is not particularly limited as long as they have an acidic group such as a sulfonic group, a carboxyl group or a phenolic hydroxyl group. Among these, an acidic dye having a carboxyl group is preferred in view of enhancing the effect of the invention.

The acidic dye may be preferably selected in consideration of necessary properties such as solubility in an organic solvent or a developer used in development, property of salt formation with a basic compound, light absorbance, interaction with other components in the curable composition, light resistance and heat resistance.

The following are specific examples of the acidic dyes (and/or derivatives thereof). However, the invention is not limited to these examples.

Acid alizarin violet N;

acid black 1, 2, 24, 48;

acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, and 340;

acid chrome violet K;

acid Fuchsin;

acid green 1, 3, 5, 9, 16, 25, 27, 50, 58, 63, 65, 80, 104, 105, and 106, 109;

acid orange 6, 7, 8, 10, 12, 26, 50, 51, 52, 56, 62, 63, 64, 74, 75, 94, 95, 107, 108, 169, and 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 295, 308, 312, 315, 316, 339, 341, 345, 346, 349, 382, 383, 394, 401, 412, 417, 418, 422, and 426;

acid violet 6B, 7, 9, 17, and 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, and 251;

Direct Yellow 2, 33, 34, 35, 38, 39, 43, 47, 50, 54, 58, 68, 69, 70, 71, 86, 93, 94, 95, 98, 102, 108, 109, 129, 136, 138, and 141;

Direct Orange 34, 39, 41, 46, 50, 52, 56, 57, 61, 64, 65, 68, 70, 96, 97, 106, and 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, and 250;

Direct Violet 47, 52, 54, 59, 60, 65, 66, 79, 80, 81, 82, 84, 89, 90, 93, 95, 96, 103, and 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, and 293;

Direct Green 25, 27, 31, 32, 34, 37, 63, 65, 66, 67, 68, 69, 72, 77, 79, and 82;

Mordant Yellow 5, 8, 10, 16, 20, 26, 30, 31, 33, 42, 43, 45, 56, 60, 61, 62, and 65;

Mordant Orange 3, 4, 5, 8, 12, 13, 14, 20, 21, 23, 24, 28, 29, 32, 34, 35, 36, 37, 42, 43, 47, and 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, and 95;

Mordant Violet 2, 4, 5, 7, 14, 22, 24, 30, 31, 32, 37, 40, 41, 44, 45, 47, 48, 53, and 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, and 84;

Mordant Green 1, 3, 4, 5, 10, 15, 19, 26, 29, 33, 34, 35, 41, 43, and 53;

Food Yellow 3;

and derivatives thereof, although the invention is not limited thereto.

Among these, acid blue 23, 25, 29, 62, 80, 86, 87, 92, 138, 158, 182, 243, and 324:1;

acid orange 8, 51, 56, 63, and 74;

acid red 1, 4, 8, 34, 37, 42, 52, 57, 80, 87, 97, 114, 143, 145, 151, 183, 217, and 249;

acid violet 7;

acid yellow 17, 23, 25, 29, 34, 42, 72, 76, 99, 111, 112, 114, 116, 134, 155, 169, 172, 184, 220, 228, 230, 232, and 243;

acid Green 25; and derivatives of these dyes.

Acidic dyes other than those as listed above, such as azo dyes, xanthene dyes and phthalocyanine dyes, are also preferable. Further, acidic dyes such as C. I. Solvent Blue 44 and 38, C. I. Solvent Orange 45, Rhodamine B, Rhodamine 110, and 3-[(5-chloro-2-phenoxyphenyl)hydrazono]-3,4-dihydro-4-oxo-5-[(phenylsulfonyl)amino]-2,7-naphthalenedisulfonic acid and derivatives thereof are also preferably used.

The derivatives of an acidic dye include inorganic salts of an acidic dye having an acidic group such as a sulfonic group or a carboxyl group, salts of an acidic dye and a nitrogen-containing compound, and amide compounds such as sulfonamide derivatives of an acidic dye. The derivatives are not particularly limited as long as they can be dissolved in a curable composition when it is prepared in the form of a solution, and may be selected in consideration of necessary properties such as solubility in an organic solvent described below or a developer, light absorbance, interaction with other components in the curable composition, light resistance and heat resistance.

A salt of an acidic dye and a nitrogen-containing compound is herein explained. Methods of forming a salt of an acidic dye and a nitrogen-containing compound may be effective in improving solubility of the acidic dye (imparting solubility with respect to an organic solvent) or in improving heat resistance and light resistance.

A nitrogen-containing compound that forms a salt with an acidic dye and a nitrogen-containing compound that forms an amide bond with an acidic dye are selected in consideration of the properties of the salt or amide compound including solubility in an organic solvent or a developer, ability of forming a salt, light absorbance and chromatic valence of the dye, interaction with other components in the curable composition, and light resistance and heat resistance as a colorant. When selecting a nitrogen-containing compound only in view of light absorbance and chromatic valence, the molecular weight of the nitrogen-containing compound may be preferably as low as possible, more preferably 300 or less, yet more preferably 280 or less, and particularly preferably 250 or less.

The molar ratio (hereinafter, referred to as "n" in the following) of the nitrogen-containing compound to the acidic dye (namely, [(mole number of the nitrogen-containing compound)×(number of base groups in the nitrogen-containing compound)]/[(mole number of the acidic dye)×(number of acidic groups in the salt of an acidic dye)]) is explained. n is a value that determines the molar ratio of the acidic dye molecules to the nitrogen-containing compound (amine compound) that serves as a counter ion, and may be freely selected in accordance with the conditions for forming an acidic dye-amine compound salt. Specifically, the value in a range of 0<n≤5 with respect to the number of acidic functional groups in the acidic dye is commonly used in practical applications, and is selected after consideration of necessary properties such as solubility in an organic solvent or a developer, ability of forming a salt, light absorbance, interaction with other components in the curable composition, light resistance and heat resistance. When selecting the value of n only in view of light absorbance, n is preferably a value satisfying 0<n≤4.5, more preferably a value satisfying 0<n≤4, and particularly preferably a value satisfying 0<n≤3.5.

Since the acidic dye as mentioned above is formed by introducing an acidic group into the structure, it may be formed into a non-acidic dye by changing the substituent. While there are cases in which an acidic dye acts favorably during alkali development, there are also cases in which over-development is caused by the acidic dye. In such cases, a non-acidic dye may be suitably used. Preferable examples of the non-acidic dye include a compound having a structure of the aforementioned acidic dye, except that an acidic group does not exist.

When complementary colors of yellow, magenta and cyan are employed, dyes of a single color may be used for each color. When primary colors of red, green and blue are employed, it is preferred to combine two or more kinds of dyes for each color in view of the color hue. In the case of using organic solvent-soluble acidic dyes, it is preferred to compose a primary color system by combining two or more kinds of dyes.

In the case in which the two or more kinds of organic solvent-soluble acidic dyes are used in combination, it is preferred to use two or more kinds of organic solvent-soluble acidic dyes having different absorption properties in a mixed system (mixture) in order to form a favorable color dye of a primary color system.

Examples of the absorption properties include a maximum absorption wavelength. In such cases, for example, it is preferred to combine dyes having maximum absorption wavelengths different from each other by 50 nm to 250 nm, more preferably dyes having maximum absorption wavelengths different from each other by 50 nm to 200 nm.

Preferable examples of the combination of the organic solvent-soluble acidic dyes include a combination of Acid Yellow 23 and Acid Red 87 (mass ratio: 1:1), a combination of Valifast Yellow 1101 and Acid Red 57 (mass ratio: 2:3), a combination of Direct Yellow 33 and Direct Green 27 (mass ratio: 2:3), and a combination of Mordant Violet 40 and Direct Green 69 (mass ratio: 1:2).

The content of the organic solvent-soluble dye in the dye-containing negative curable composition is preferably 40 mass % or more with respective to the total solid content of the composition, although the content may vary according to the type of the dye.

Specifically, the content of the organic solvent-soluble dye is more preferably from 40 mass % to 90 mass %, further preferably from 50 mass % to 80 mass %, and particularly preferably from 55 mass % to 70 mass %, with respective to the total solid content of the composition, in view of further suppressing heat sag that may occur during performing a heat treatment of a cured pattern after patterning (after exposure, development or the like), further improving adherence of the cured pattern to the support, and further improving a color residual ratio after the development.

When two or more kinds of organic solvent-soluble dyes are mixed to form a color, the organic solvent-soluble dye that is added in the smallest amount is preferably added in an amount of at least 10 mass % with respect to the total amount of the organic solvent-soluble dyes being 100 mass %, in view of a color hue.

(B) Photo-Polymerization Initiator

The dye-containing negative curable composition includes at least one kind of photo-polymerization initiator. The photo-polymerization initiator acts on the (C) polymerizable compound described below, and cures the composition. The photo-polymerization initiator is not limited as long as it can polymerize the (C) polymerizable compound, and may be preferably selected in view of its properties, initiation efficiency, absorption wavelength, availability, costs or the like.

Examples of the photo-polymerization initiator include at least one active halide compound selected from a halomethyloxadiazole compound or a halomethyl-s-triazine compound, 3-aryl substituted coumarin coumpounds, lophine dimers, benzophenone compounds, acetophenone compounds and derivatives thereof, cyclopentadiene-benzene-iron complexes and salts thereof, and oxime compounds.

Examples of the active halogen compounds as a halomethyloxadiazole compound include 2-halomethyl-5-vinyl-1,3,4-oxadiazole compounds and the like described in Japanese Patent Publication (JP-B) No. 57-6096, 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole.

Examples of the active halogen compound as a halomethyl-s-triazine compound include vinyl-halomethyl-s-triazine compounds described in JP-B No. 59-1281, 2-(naphth-1-yl)-4,6-bis(halomethyl)-s-triazine compounds described in JP-A No. 53-133428 and 4-(p-aminophenyl)-2,6-bis(halomethyl)-s-triazine compounds.

Specific examples of the halomethyl-s-triazine compounds include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis(trichloromethyl)-s-triazine, 2-(4-methoxy-naphth-1-yl)-4,6-bis(trichloromethyl)-s-triazine, 2-(4-ethoxy-naphth-1-yl)-4,6-bis(trichloromethyl)-s-triazine, 2-(4-butoxy-naphth-1-yl)-4,6-bis(trichloromethyl)-s-triazine, 2-[4-(2-methoxyethyl)-naphth-1-yl]-4,6-bis(trichloromethyl)-s-triazine, 2-[4-(2-ethoxyethyl)-naphth-1-yl]-4,6-bis(trichloromethyl)-s-triazine, 2-[4-(2-butoxyethyl)-naphth-1-yl]-4,6-bis(trichloromethyl)-s-triazine, 2-(2-methoxy-naphth-1-yl)-4,6-bis(trichloromethyl)-s-triazine, 2-(6-methoxy-5-methyl-naphth-2-yl)-4,6-bis(trichloromethyl)-s-triazine, 2-(6-methoxy-naphth-2-yl)-4,6-bis(trichloromethyl)-s-triazine, 2-(5-methoxy-naphth-1-yl)-4,6-bis(trichloromethyl)-s-triazine, 2-(4,7-dimethoxy-naphth-1-yl)-4,6-bis(trichloromethyl)-s-triazine, 2-(6-ethoxy-naphth-2-yl)-4,6-bis(trichloromethyl)-s-triazine, 2-(4,5-dimethoxynaphth-1-yl)-4,6-bis(trichloromethyl)-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-bis(trichloromethyl)-s-triazine, 4-[p-N,N-di(chloroethyl)aminophenyl]-2,6-bis(trichloromethyl)-s-triazine, 4-[o-methyl-p-N,N-di(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-di(phenyl)aminophenyl]-2,6-bis(trichloromethyl)-s-triazine, 4-(p-N-chloroethylcarbonylaminophenyl)-2,6-bis(trichloromethyl)-s-triazine, 4-[p-N-(p-methoxyphenyl)carbonylaminophenyl]-2,6-bis(trichloromethyl)-s-triazine, 4-[m-N,N-di(ethoxycarbonylmethyl)animophenyl]-2,6-bis(trichloromethyl)-s-triazine, 4-[m-bromo-p-N,N-di(ethoxycarbonylmethyl)animophenyl]-2,6-bis(trichloromethyl)-s-triazine, 4-[m-chloro-p-N,N-di(ethoxycarbonylmethyl)animophenyl]-2,6-bis(trichloromethyl)-s-triazine, 4-[m-fluoro-p-N,N-di(ethoxycarbonylmethyl)animophenyl]-2,6-bis(trichloromethyl)-s-triazine, 4-[o-bromo-p-N,N-di(ethoxycarbonylmethyl)animophenyl]-2,6-bis(trichloromethyl)-s-triazine, 4-[o-chloro-p-N,N-di(ethoxycarbonylmethyl)animophenyl]-2,6-bis(trichloromethyl)-s-triazine, 4-[o-fluoro-p-N,N-di(ethoxycarbonylmethyl)animophenyl]-2,6-bis(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-bis(trichloromethyl)-s-triazine, 4-[o-fluoro-p-N,N-di(chloroethyl)aminophenyl]-2,6-bis(trichloromethyl)-s-triazine, 4-[m-bromo-p-N,N-di(chloroethyl)aminophenyl]-2,6-bis(trichloromethyl)-s-triazine, 4-[m-chloro-p-N,N-di(chloroethyl)aminophenyl]-2,6-bis(trichloromethyl)-s-triazine, 4-[m-fluoro-p-N,N-di(chloroethyl)aminophenyl]-2,6-bis(trichloromethyl)-s-triazine, 4-(m-bromo-p-N-ethoxycarbonylmethylanimophenyl)-2,6-bis(trichloromethyl)-s-triazine, 4-(m-chloro-p-N-ethoxycarbonylmethylanimophenyl)-2,6-di(trichloromethyl)-s-triazine, 4-(m-fluoro-p-N-ethoxycarbonylmethylanimophenyl)-2,6-bis(trichloromethyl)-s-triazine, 4-(o-bromo-p-N-ethoxycarbonylmethylanimophenyl)-2,6-bis(trichloromethyl)-s-triazine, 4-(o-chloro-p-N-ethoxycarbonylmethylanimophenyl)-2,6-bis(trichloromethyl)-s-triazine, 4-(o-fluoro-p-N-ethoxycarbonylmethylanimophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, and 4-(o-fluoro-p-N-chloroethylaminophenyl)-2,6-bis(trichloromethyl)-s-triazine.

Other examples of the photo-polymerization initiator include the TAZ series produced by Midori Kagaku Co., Ltd. (for example, TAZ-107, TAZ-110, TAZ-104, TAZ-109, TAZ-140, TAZ-204 TAZ-113 and TAZ-123), the T series produced by Panchim Ltd. (for example, T-OMS, T-BMP, T-R and T-B), the IRGACURE® series (for example, IRGACURE 651, IRGACURE 184, IRGACURE 500, IRGACURE 1000, IRGACURE 149, IRGACURE 819 and IRGACURE 261) and DALOCURE® series (for example, DALOCURE 1173) produced by Ciba Specialty Chemicals, 4,4'-bis(diethylamino)-benzophenone, 2-(O-benzoyloxime)-1-[4-(phenylthio)phenyl]-1,2-octanedione, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropyl ether.

Among these photo-polymerization initiators, oxime compounds are preferable, and particularly preferable example thereof include 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone.

A sensitizer and/or a light stabilizer may be used together with these photo-polymerization initiators.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzil, dibenzylacetone, p-(dimethylamino)phenylstyrylketone, p-(dimethylamino)phenyl-p-methylstyrylketone, benzophenone, p-(dimethylamino)benzophenone (or Michler's ketone), p-(diethylamino)benzophenone, benzoanthrone, benzothiazole compounds decribed in JP-B No. 51-48516, and TINUVIN 1130 and 400 manufactured by Nagase & Co., Ltd.

In addition to the photo-polymerization initiators, other known photo-polymerization initiators may be used in the dye-containing negative curable composition.

Specific examples of these known photo-polymerization initiators include vicinal polyketol aldonil compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, combinations of triaryl imidazole dimer with p-aminophenyl ketone disclosed in U.S. Pat. No. 3,549,367 and combinations of benzothiazole compounds with trihalomethyl-s-triazine compounds disclosed in JP-B No. 51-48516.

The content of the photo-polymerization initiator with respect to the total solid content (mass) of the photo-polymerizable compound described below is preferably from 0.01 mass % to 50 mass %, more preferably from 1 mass % to 30 mass %, and particularly preferably from 1 mass % to 20 mass %. When the content of the photo-polymerization initiator is from 0.01 mass % to 50 mass %, polymerization may easily proceed and film strength may be sufficiently improved.

(C) Polymerizable Compound

The polymerizable compound is preferably a compound having at least one ethylenic unsaturated double bond having an ability of addition polymerization and having a boiling point of 100° C. or less under ordinary pressure. By including a polymerizable compound together with a photo-polymerization initiator, a negative-working photo-polymerizable layer (dye-containing negative curable composition) can be formed.

Examples of the polymerizable compound include: monofunctional acrylates and methacrylates such as polyethylene glycol mono(meth)acrylate, polypropylene glycol mono(meth)acrylate and phenoxyethyl(meth)acrylate; polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylol propane tri(acryloyloxypropyl)ether, tri(acryloyloxyethyl)isocyanurate; compounds formed by adding ethylene oxide or propylene oxide to polyfunctional alcohol such as glycerin or trimethylolethane and (meth)acrylating the same; urethane acrylates such as those described in JP-B Nos. 48-41708 and 50-6034 and JP-A No. 51-37193; polyester acrylates described in JP-A No. 48-64183 and JP-B Nos. 49-43191 and 52-30490; and polyfunctional acrylates and methacrylates, and mixtures thereof, such as epoxy acrylates that are a product formed by reaction between an epoxy resin and (meth)acrylic acid. Further examples include the substances presented as photocurable monomers and oligomers in the *Journal of the Adhesion Society of Japan*, Vol. 20, No. 7, pp. 300-308.

Among these, the polymerizable compound is preferably a polyfunctional (meth)acrylate.

The polymerizable compound may be used singly or in combination of two or more kinds thereof.

The content of the polymerizable compound with respect to the total solid content (mass) of the dye-containing negative curable composition is preferably from 0.1 mass % to 90 mass %, more preferably from 1.0 mass % to 80 mass %, and particularly preferably from 2.0 mass % to 70 mass %.

When the content is 0.1 mass % or more, curability of exposed portions may be improved, and when the content is 90 mass % or less, solubility of unexposed portions may be improved.

(D) Amino Group-Containing Alkali-Soluble Resin

The (D) amino group-containing alkali-soluble resin is a polymer compound (hereinafter also referred to as a "specific polymer compound") having, in a side chain thereof, a structure represented by the following Formula (1). The (D) amino group-containing alkali-soluble resin is not particularly limited as long as it is an alkali-soluble resin having this structure in a side chain thereof.

Formula (1)

In Formula (1), $R_1$ and $R_2$ each independently represent a hydrogen atom or a monovalent organic group, and $R_1$ and $R_2$ may be linked with each other to form a ring structure.

Preferable examples of the monovalent organic group include an alkyl group, an alkenyl group, an aryl group, and a hetero cyclic group, each of which may have a substituent.

Examples of the alkyl group include linear, branched and cyclic alkyl groups having 1 to 20 carbon atoms, and specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl groups.

The alkyl group may have a substituent. The substituent is a group formed of a non-metal atomic group other than a hydrogen atom, and preferable examples thereof include halogen atoms (—F, —Br, —Cl, and —I); hydroxyl, alkoxy, aryloxy, mercapto, aklylthio, arylthio, alkyldithio, aryldithio, acyloxy, carbamoyloxy, formyl, acyl, carboxyl, alkoxycarbonyl, aryloxycarbonyl, alkylsulfinyl, arylsulfinyl, alkylsulfonyl, arylsulfonyl, alkoxysulfonyl, aryloxysulfonyl, sulfinamoyl, cyano, nitro, aryl, alkenyl, alkynyl, hetero cyclic group, and silyl groups.

Examples of the alkenyl group include an alkenyl group having 2 to 20 carbon atoms.

The alkenyl group may have a substituent, and examples of the substituent include those listed above as the substituents for substituted alkyl groups.

Specific examples of the alkenyl group include vinyl, 1-propenyl, 1-butenyl, cinnamyl, and 2-chloro-1-ethenyl groups.

Examples of the alkynyl group include an alkynyl group having 2 to 20 carbon atoms.

The alkynyl group may have a substituent, and examples of the substituent include those listed above as the substituents for substituted alkyl groups.

Specific examples of the alkynyl group include ethynyl, 1-propynyl, 1-butynyl, and trimethyl ethynyl groups.

Examples of the aryl group include an aryl group having 6 to 20 carbon atoms, such as a single benzene ring, a condensed ring formed from two or three benzene rings, and a condensed ring formed from a benzene ring and a 5-membered unsaturated ring. Specific examples thereof include phenyl, biphenyl, naphthyl, anthryl, phenanthryl, indenyl, acenaphthenyl, and fluorenyl groups, and preferable examples among these include phenyl and naphthyl groups.

The aryl group may have a substituent, and examples of the substituent include those listed above as the substituents for substituted alkyl groups. Specific examples of the aryl group include tolyl, xylyl, mesityl, cumenyl, chlorophenyl, bromophenyl, chloromethylphenyl, hydroxyphenyl, methoxyphenyl, ethoxyphenyl, phenoxyphenyl, acetyloxyphenyl, benzoyloxyphenyl, methylthiophenyl, phenylthiophenyl, carboxyphenyl, methoxycarbonylphenyl, ethoxycarbonylphenyl, phenoxycarbonylphenyl, cyanophenyl, sulfophenyl, sulfonatophenyl, and phosphonatophenyl groups.

Examples of the hetero cyclic ring group include a monovalent organic group derived from pyridine, triazine, furan or pyran.

The hetero cyclic ring group may have a substituent, and examples of the substituent include those listed above as the substituents for substituted alkyl groups.

Examples of the ring structure formed from $R_1$ and $R_2$ linked to each other in Formula (1) include morpholine, piperazine, pyrrolidine, pyrrole, and indoline. These ring structures may have a substituent such as those listed above. Among these, the ring structure is preferably an aliphatic ring.

$R_1$ and $R_2$ in Formula (1) are more preferably a linear alkyl group having 1 to 12 carbon atoms, a branched alkyl group having 3 to 12 carbon atoms, or a cyclic alkyl group having 5 to 10 carbon atoms; further preferably a linear alkyl group having 1 to 8 carbon atoms, a branched alkyl group having 3 to 8 carbon atoms, or a cyclic alkyl group having 5 to 8 carbon atoms, in view of exhibiting strong interaction with a dye; and particularly preferably a linear alkyl group having 1 to 4 carbon atoms.

The (D) amino group-containing alkali-soluble resin is preferably a polymer compound having a repeating unit represented by the following Formula (2). The (D) amino group-containing alkali-soluble resin may have two or more kinds of repeating unit represented by Formula (2).

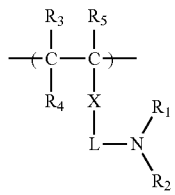

Formula (2)

In Formula (2), $R_1$ and $R_2$ have the same definitions as $R_1$ and $R_2$ in Formula (1), respectively, and preferable examples thereof are also the same; $R_3$, $R_4$, and $R_5$ each independently represent a hydrogen atom or a monovalent organic group; X represents a phenylene group, *—C(=O)—O— or *—C(=O)—$NR_6$—, in which $R_6$ represents a hydrogen atom or a monovalent organic group, and * represents a site at which X bonds to the main chain of the (D) amino group-containing alkali-soluble resin; and L represents a single bond or a divalent linking group.

Examples of the monovalent organic group represented by $R_3$, $R_4$, $R_5$ or $R_6$ include an alkyl group and an aryl group, and preferable examples thereof include a substituted or unsubstituted alkyl group.

The alkyl group represented by $R_3$, $R_4$, $R_5$ or $R_6$ is preferably an alkyl group having 1 to 12 carbon atoms, more preferably an alkyl group having 1 to 8 carbon atoms, and particularly preferably an alkyl group having 1 to 4 carbon atoms.

In the case in which the alkyl group represented by $R_3$, $R_4$, $R_5$ or $R_6$ has a substituent, examples of the substituent include hydroxy, alkoky (preferably having 1 to 5 carbon atoms, and more preferably having 1 to 3 carbon atoms), methoxy, ethoxy, and cyclohexyloxy groups.

Specific examples of the alkyl group represented by $R_3$, $R_4$, $R_5$ or $R_6$ include methyl, ethyl, propyl, n-butyl, i-butyl, t-butyl, n-hexyl, cyclohexyl, 2-hydroxyethyl, 3-hydroxypropyl, 2-hydroxypropyl, and 2-methoxyethyl groups.

$R_3$, $R_4$, and $R_6$ are particularly preferably a hydrogen atom, and $R_5$ is particularly preferably a hydrogen atom or a methyl group.

L represents a single bond or a divalent linking group. Preferable examples of the divalent linking group include a substituted or unsubstituted alkylene group. The alkylene group are preferably an alkylene group having 1 to 12 carbon atoms, more preferably an alkylene group having 1 to 8 carbon atoms, and particularly preferably an alkylene group having 1 to 4 carbon atoms.

The alkylene group represented by L may include two or more alkylene groups linked to each other via a hetero atom such as an oxygen atom, a nitrogen atom, or a sulfur atom.

Preferable examples of the alkylene group represented by L include methylene, ethylene, propylene, trimethylene, and tetramethylene groups.

In the case in which the alkylene group represented by L has a substituent, examples of the substituent include a hydroxy group.

The divalent linking group represented by L may have a hetero atom or a partial structure containing a hetero atom at a terminal end of the alkylene group, and may be linked to the amino group in Formula (2) via the hetero atom or the partial structure containing a hetero atom. The hetero atom or the partial structure containing a hetero atom is selected from —O—, —S—, *—C(=O)O—, *—CONH—, *—C(=O)S—, *—S—C(=O)—, —NHCONH—, *—NHC(=O)O—, *—NHC(=O)S—, *—S—NHC(=O)—, *—OC(=O)—, *—OCONH—, or *—NHCO—, in which * represents a site at which L bonds to the main chain of the (D) amino group-containing alkali-soluble resin.

The (D) amino group-containing alkali-soluble resin may be a polymer compound having the repeating unit represented by Formula (2). The repeating unit represented by Formula (2) may be formed by using the monomer represented by the following Formula (3).

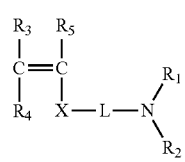

Formula (3)

In Formula (3), $R_1$, $R_2$, $R_3$, $R_4$, $R_5$, X and L have the same definitions as $R_1$, $R_2$, $R_3$, $R_4$, $R_5$, X and L in Formula (2), respectively.

Preferable examples of the monomer represented by Formula (3) are shown below. However, the invention is not limited to these examples.

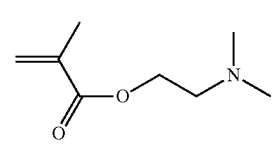

(A-1)

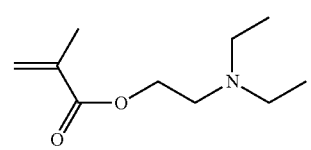

(A-2)

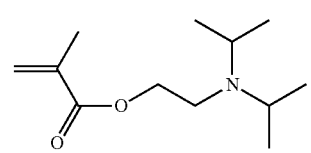

(A-3)

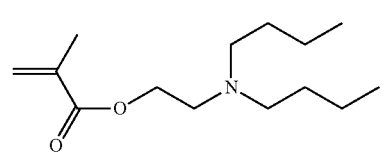

(A-4)

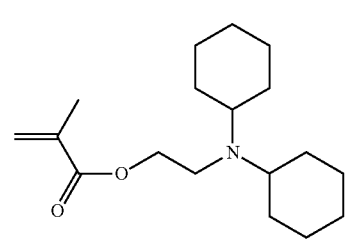

(A-5)

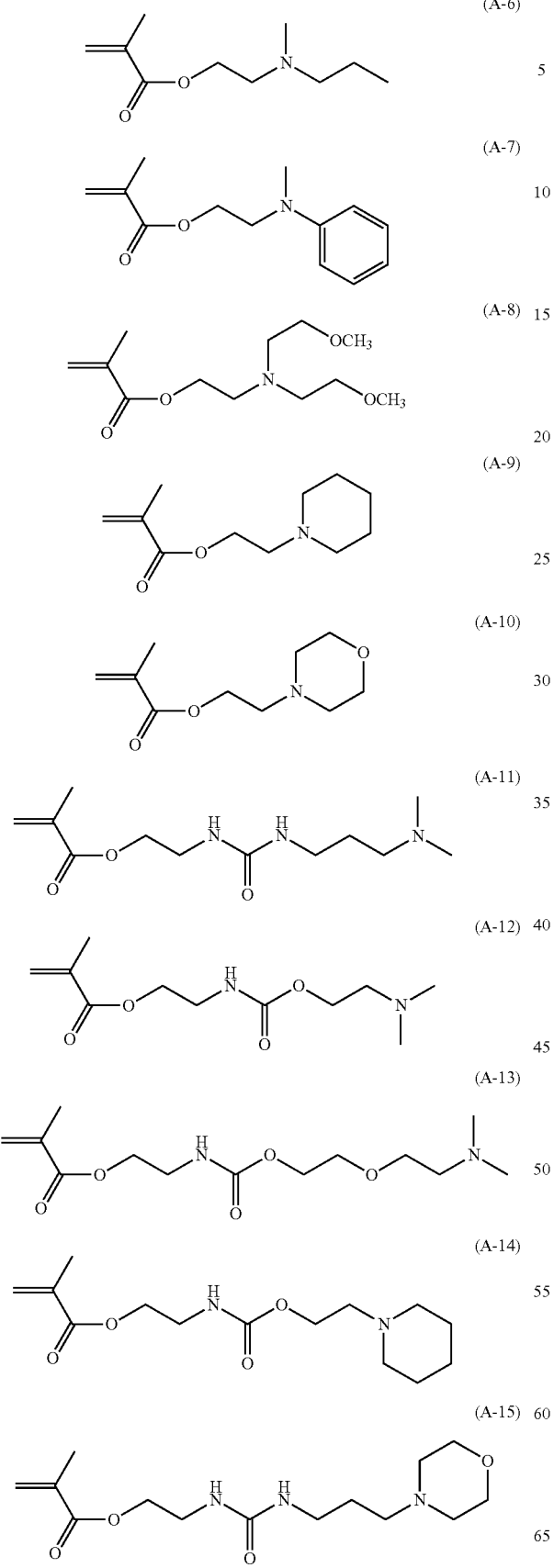
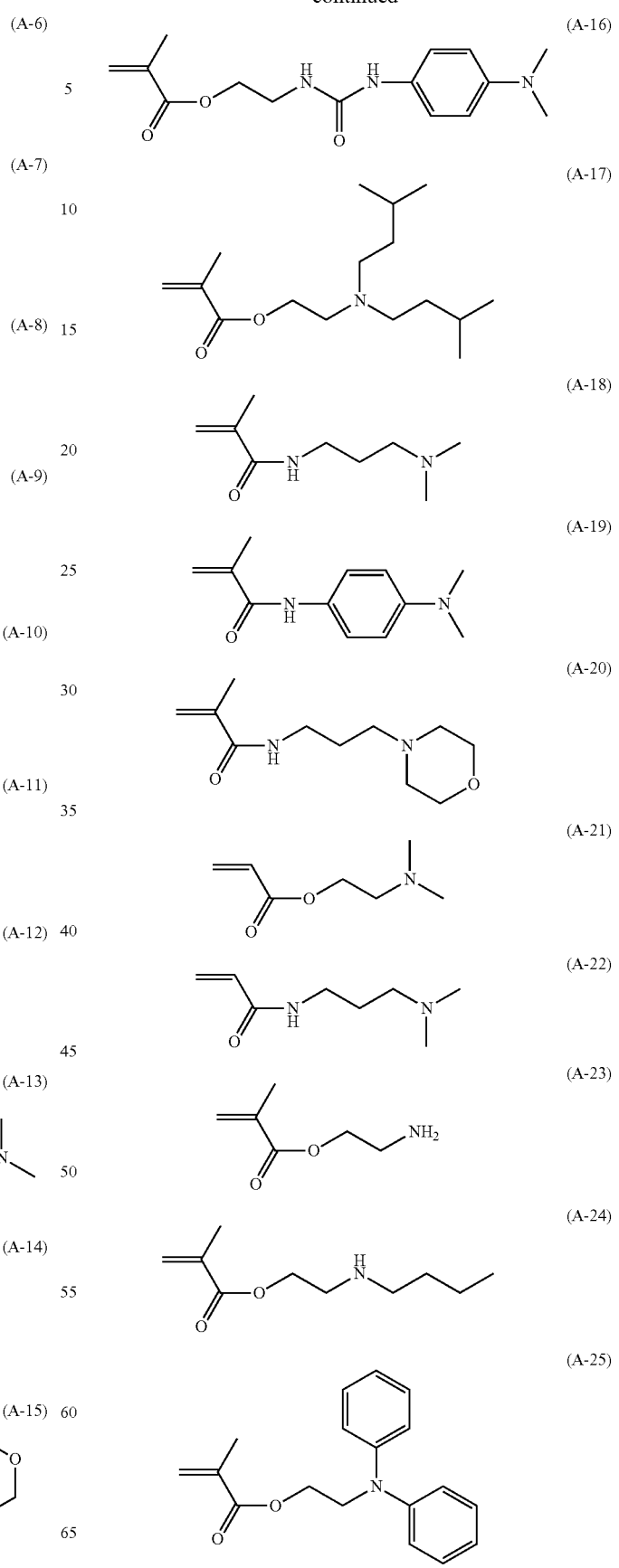

-continued

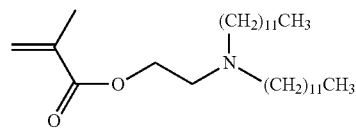
(A-26)

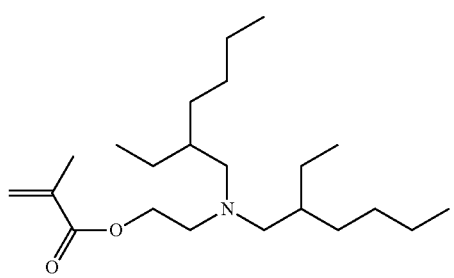
(A-27)

The amino value of the (D) amino group-containing alkali-soluble resin having an amino group in its side chain is not particularly limited, but is preferably from 5 mgKOH/g to 200 mgKOH/g, more preferably from 10 mgKOH/g to 100 mgKOH/g, and particularly preferably from 10 mgKOH/g to 80 mgKOH/g, in view of suppressing generation of remaining films and residuals left after the development.

The amino value, as the content of amino groups, is preferably 5 mgKOH/g or more in view of promoting development of dye in a non-image portion (remaining films and residuals), and is preferably 200 mgKOH/g or less in view of suppressing strengthening of aggregation among the amino groups in order to make it difficult to form deposits due to the aggregation of the dye.

Namely, in order to promote development of a non-image portion, the amino value is preferably within the above range.

The (D) amino group-containing alkali-soluble resin preferably further contains a structural unit derived from a monomer having an acidic group.

The inclusion of the structural unit derived from a monomer having an acidic group in the (D) amino group-containing alkali-soluble resin is preferable since favorable removability of unexposed portions can be achieved when the resin is used in the photosensitive composition.

Examples of the structural unit derived from a monomer having an acidic group include: unsaturated monocarboxylic acids such as acrylic acid, methacrylic acid, crotonic acid, α-chloroacrylic acid, and cinnamic acid; unsaturated dicarboxylic acids and anhydrides thereof such as maleic acid, maleic acid anhydride, fumaric acid, itaconic acid, itaconic acid anhydride, citraconic acid, citraconic acid anhydride, and mesaconic acid; unsaturated polyvalent carboxylic acids having a tri- or more-valency and anhydrides thereof; mono [(meth)acryloyloxyalkyl]esters of polyvalent carboxylic acids having di- or more-valency such as mono(2-acryloyloxyethyl)succinate, mono(2-methacryloyloxyethyl)succinate, mono(2-acryloyloxyethyl)phthalate, and mono(2-methacryloyloxyethyl)phthalate; and mono(meth)acrylates of polymers having a carboxyl group at both terminals such as ω-carboxy-polycaprolactone monoacrylate and ω-carboxy-polycaprolactone monomethacrylate.

The (D) amino group-containing alkali-soluble resin may include only one kind of the structural unit derived from a monomer having an acidic group, or may include two or more kinds thereof.

The acid value of the (D) amino group-containing alkali-soluble resin is preferably from 10 mgKOH/g to 200 mgKOH/g, more preferably from 30 mgKOH/g to 200 mgKOH/g, and particularly preferably from 50 mgKOH/g to 180 mgKOH/g.

The acid value is preferably 10 mgKOH/g or more in view of suppressing generation of deposits in a developer. The acid value is preferably 200 mgKOH/g or less in view of suppressing strengthening of aggregation among the acid groups so that formation of deposits caused by generation of aggregation of dye can be suppressed. Namely, the content of the structural unit derived from a monomer having an acidic group is preferably within the above range in view of promoting development of non-image portions in order to improve the removability during development.

The (D) amino group-containing alkali-soluble resin may further contain a structural unit derived from a copolymerizable vinyl monomer as long as the effect of the resin is not impaired.

The vinyl monomer that can be used herein is not particularly limited, but preferable examples thereof include (meth)acrylic acid esters, crotonic acid esters, vinyl esters, maleic acid diesters, fumaric acid diesters, itaconic acid diesters, (meth)acrylamides, vinyl ethers, esters of vinyl alcohol, styrenes, and (meth)acrylonitrile. Specific examples of the vinyl monomer include the compounds as shown below. The expression "(meth)acryl" herein means either one or both of "acryl" and "methacryl".

Examples of (meth)acrylates include methyl(meth)acrylate, ethyl(meth)acrylate, n-propyl(meth)acrylate, isopropyl (meth)acrylate, n-butyl(meth)acrylate, isobutyl(meth)acrylate, t-butyl(meth)acrylate, n-hexyl(meth)acrylate, cyclohexyl(meth)acrylate, t-butylcyclohexyl(meth)acrylate, 2-ethylhexyl(meth)acrylate, t-octyl(meth)acrylate, dodecyl (meth)acrylate, octadecyl(meth)acrylate, acetoxyethyl (meth)acrylate, phenyl(meth)acrylate, 2-hydroxyethyl(meth) acrylate, 2-methoxyethyl(meth)acrylate, 2-ethoxyethyl (meth)acrylate, 2-(2-methoxyethoxy)ethyl(meth)acrylate, 3-phenoxy-2-hydroxypropyl(meth)acrylate, benzyl(meth) acrylate, diethylene glycol monomethyl ether(meth)acrylate, diethylene glycol monoethyl ether(meth)acrylate, triethylene glycol monomethyl ether(meth)acrylate, polyethylene glycol monomethyl ether(meth)acrylate, polyethylene glycol monoethyl ether(meth)acrylate, β-phenoxyethoxyethyl(meth) acrylate, nonylphenoxy polyethylene glycol(meth)acrylate, dicyclopentenyl(meth)acrylate, dicyclopentenyloxyethyl (meth)acrylate, trifluoroethyl(meth)acrylate, octafluoropentyl(meth)acrylate, perfluorooctylethyl(meth)acrylate, dicyclopentanyl(meth)acrylate, tribromophenyl(meth)acrylate, and tribromohenyloxyethyl(meth)acrylate.

Examples of crotonic acid esters include butyl crotonate and hexyl crotonate.

Examples of vinyl esters include vinyl acetate, vinyl propionate, vinyl butyrate, vinyl methoxyacetate, and vinyl benzoate.

Examples of maleic acid diesters include dimethyl maleate, diethyl maleate, and dibutyl maleate.

Examples of fumaric acid diesters include dimethyl fumarate, diethyl fumarate, and dibutyl fumarate.

Examples of itaconic acid diesters include dimethyl itaconate, diethyl itaconate, and dibutyl itaconate.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth) acrylamide, N-cyclohexyl(meth)acrylamide, N-(2-methoxyethyl)(meth)acrylamide, N,N-dimethyl(meth)acrylamide, N, N-diethyl(meth)acrylamide, N-phenyl(meth)

acrylamide, N-benzyl(meth)acrylamide, (meth)acryloyl morpholine, and diacetone acrylamide.

Examples of vinyl ethers include methyl vinyl ether, butyl vinyl ether, hexyl vinyl ether, and methoxyethyl vinyl ether.

Examples of esters of vinyl alcohol include vinyl acrylate and vinyl methacrylate.

Examples of styrenes include styrene, methyl styrene, dimethyl styrene, trimethyl styrene, ethyl styrene, isopropyl styrene, butyl styrene, hydroxy styrene, methoxy styrene, buthoxy styrene, acetoxy styrene, chloro styrene, dichloro styrene, bromo styrene, chloromethyl styrene, hydroxystyrene protected by a group deprotectable with an acidic substance (such as t-Boc), vinyl methyl benzoate, and α-methyl styrene.

The (D) amino group-containing alkali-soluble resin preferably has a weight-average molecular weight (Mw) of from 1,000 to 100,000 and a number-average molecular weight (Mn) of from 400 to 50,000, more preferably has a weight-average molecular weight (Mw) of from 3,000 to 100,000 and a number-average molecular weight (Mn) of from 2,000 to 30,000, further preferably has a weight-average molecular weight (Mw) of from 5,000 to 50,000 and a number-average molecular weight (Mn) of from 2,000 to 30,000, and particularly preferably has a weight-average molecular weight (Mw) of from 8,000 to 30,000 and a number-average molecular weight (Mn) of from 4,000 to 12,000.

The weight-average molecular weight (Mw) of the (D) amino group-containing alkali-soluble resin is preferably 1,000 or more in view of promoting development of dye in non-image portions, and is preferably 100,000 or less in view of developability of the dye-containing negative curable composition (photo-curable composition) during production of color filters.

The content of the (D) amino group-containing alkali-soluble resin in the dye-containing negative curable composition, in terms of mass ratio of the (D) amino group-containing alkali-soluble resin/the dye, is preferably from $1/100$ to $100/100$, more preferably from $5/100$ to $80/100$, and further preferably from $10/100$ to $50/100$.

The (D) amino group-containing alkali-soluble resin can be produced by an ordinary radical-polymerization method using, for example, the monomer represented by Formula (3) and a further radical-polymerizable monomer as a compolymerization component. For this process, a suspension polymerization method, a solution polymerization method or the like is generally employed. Examples of a solvent used for synthesizing a polymer include ethylene dichloride, cyclohexanone, methyl ethyl ketone, acetone, methanol, ethanol, propanol, butanol, ethylene glycol monomethylether, ethylene glycol monoethylether, 2-methoxyethyl acetate, 1-methoxy-2-propanol, 1-methoxy-2-propylacetate, N,N-dimethylformamide, N,N-dimethylacetamide, dimethyl sulfoxide, toluene, ethyl acetate, methyl lactate, and ethyl lactate. These solvents may used singly or as a mixture of two or more kinds thereof.

A radical-polymerization initiator may be used during the radical polymerization, and further, a chain transfer agent such as 2-mercaptoethanol or dodecylmercaptan may be used.

(E) Organic Solvent

The dye-containing negative curable composition contains at least one kind of an organic solvent. The organic solvent is not basically particularly limited as long as it satisfies solubility of each component and coatability of the dye-containing negative curable composition, and is preferably selected in consideration of solubility, coatability and safety of the dye and the binder.

Examples of the organic solvent include: esters such as amyl formate; alkyl esters of acetic acid such as ethyl acetate, n-butyl acetate, isobutyl acetate, isoamyl acetate, and isobutyl acetate; butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionate alkyl esters such as methyl 3-oxypropionate and ethyl 3-oxypropionate (specifically, methyl 3-methoxypropionate, ethyl 3-methoxypropionate, methyl 3-ethoxypropionate and ethyl 3-ethoxypropionate); 2-oxypropionate alkyl esters such as methyl 2-oxypropionate, ethyl 2-oxypropionate and propyl 2-oxypropionate (specifically, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate and ethyl 2-ethoxy-2-methylpropionate; methyl pyruvate, ethyl pyruvate, propyl pyruvate, methyl acetoacetate, ethyl acetoacetate, methyl 2-oxobutanate, and ethyl 2-oxobutanate;

ethers such as diethylene glycol dimethyl ether, tetrahydrofuran, ethylene glycol monomethyl ether, ethylene glycol monoethyl ether, methyl cellosolve acetate, ethyl cellosolve acetate, ethyl carbitol acetate, butyl carbitol acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate and propylene glycol monopropyl ether acetate;

ketones such as methyl ethyl ketone, cyclohexanone, 2-heptanone and 3-heptanone; and aromatic hydrocarbons such as toluene and xylene.

It is also preferable to mix two or more kinds of these organic solvents in view of the solubility of the dye, and when an alkali-soluble resin (binder) is included, further in view of the solubility of alkali-soluble resin, as well as improving the state of the coated surface or the like. In this case, a mixture solution of two or more kinds selected from methyl 3-ethoxypropionate, ethyl 3-ethoxypropionate, ethyl cellosolve acetate, ethyl lactate, diethylene glycol dimethyl ether, butyl-n-acetate, methyl 3-methoxypropionate, 2-heptanone, cyclohexanone, ethyl carbitol acetate, butyl carbitol acetate, propylene glycol monomethyl ether and propylene glycol monomethyl ether acetate, is suitably used.

The amount of the organic solvent to be used is preferably determined such that the total solid content of the dye-containing negative curable composition is from 5 mass % to 80 mass %, more preferably from 7 mass % to 60 mass %, and further preferably from 10 mass % to 50 mass %, in view of improving coatability.

(F) Other Components

The dye-containing negative curable composition may contain, in addition to the above components, other component(s) such as an alkali-soluble binder which is different from the (D) amino group-containing alkali-soluble resin or a crosslinking agent, as long as the effect of the invention is not impaired.

Alkali-Soluble Binder

The alkali-soluble binder is not specifically limited as long as it has alkali-solubility, and is preferably selected in view of heat resistance, developability, availability or the like.

Preferable examples of the alkali-soluble binder include a linear organic high-molecular polymer that can be dissolved in an organic solvent and can be developed with a weak alkali aqueous solution. Examples of such linear organic high-molecular polymer include a polymer having carboxylic acid in its side chain, such as methacrylic acid copolymers, acrylic acid copolymers, itaconic acid copolymers, crotonic acid copolymers, maleic acid copolymers and partially-esterified maleic acid copolymers as described in JP-A No. 59-44615, JP-B Nos. 54-34327, 58-12577 and 54-25957 and JP-A Nos. 59-53836 and 59-71048. An acidic cellulose derivative having carboxylic acid in its side chain is also suitably used.

In addition to these binders, polymers produced by adding an acid anhydride to a polymer having a hydroxy group, polyhydroxystyrene resins, polysiloxane resins, poly(2-hydroxyethyl(meth)acrylate), polyvinyl pyrrolidone, polyethylene oxides, polyvinyl alcohols, and the like are also suitably used as the alkali-soluble binder.

The linear organic high-molecular polymer may be a copolymer in which a hydrophilic monomer is copolymerized. Examples of the copolymer include alkoxyalkyl(meth)acrylates, hydroxyalkyl(meth)acrylates, glycerol(meth)acrylates, (meth)acrylamides, N-methylolacrylamides, secondary or tertiary alkylacrylamides, dialkylaminoalkyl(meth)acrylates, morpholine(meth)acrylates, N-vinylpyrrolidone, N-vinylcaprolactam, vinylimidazole, vinyltriazole, methyl(meth)acrylates, ethyl(meth)acrylates, branched or straight-chain propyl(meth)acrylates, branched or straight-chain butyl(meth)acrylates, and phenoxyhydroxy propyl(meth)acrylates.

Further, as a hydrophilic monomer, monomers having a tetrahydrofurfuryl group, a phosphoric acid group, a phosphoric acid ester group, a quaternary ammonium salt group, an ethyleneoxy chain, a propyleneoxy chain, a sulfonic acid group or a group derived from a salt of these groups, or a morpholinoethyl group are also suitable used.

The alkali-soluble binder may have a polymerizable group in its side chain in order to improve crosslinking efficiency. For example, polymers having an allyl group, a (meth)acryl group, an allyloxyalkyl groups or the like in its side chain are suitably used. Examples of the polymer having a polymerizable group include commercial products such as KS RESIST-106 (manufactured by Osaka Organic Chemical Industry Ltd.) and CYCLOMER-P series (manufactured by Daicel Chemical Industries, Ltd.). Alcohol-soluble nylons and a polyether of 2,2-bis-(4-hydroxyphenyl)propane and epichlorohydrin are also suitably used in view of improving the strength of a cured film.

Among these alkali-soluble binders, polyhydroxystyrene resins, polysiloxane resins, acrylic resins, acrylamide resins and acryl/acrylamide copolymer resins are preferable in view of improving heat resistance; and acrylic resins, acrylamide resins and acryl/acrylamide copolymer resins are preferable in view of controlling developability.

Preferable examples of the acrylic resin include a copolymer formed from a monomer selected from benzyl(meth)acrylate, (meth)acrylic acid, hydroxyethyl(meth)acrylate, (meth)acrylamide and the like, and commercial products including KS RESIST-106 manufactured by Osaka Organic Chemical Industry Ltd.) and CYCLOMER-P series (manufactured by Daicel Chemical Industries, Ltd.)

The alkali-soluble binder is preferably a polymer having a weight average molecular weight (in terms of a polystyrene-converted value measured by GPC) of from 1000 to $2\times10^5$, more preferably a polymer having a weight average molecular weight of from 2000 to $1\times10^5$, and particularly preferably a polymer having a weight average molecular weight of from 5000 to $5\times10^4$, in view of developability, liquid viscosity or the like.

Crosslinking Agent

In the invention, it is also possible to obtain a further cured film by additionally using a crosslinking agent. Explanations are hereinafter given for the crosslinking agent.

The crosslinking agent is not specifically limited as long as it can cause a film to cure by crosslinking reaction, and examples thereof include: (a) an epoxy resin having a molecular weight of less than 1,000 (compounds other than the epoxy resin included in the scope of (D)); (b) a melamine compound, a guanamine compound, a glycoluril compound or an urea compound substituted by at least one substituent selected from a methylol group, an alkoxymethyl group or an acyloxymethyl group; and (c) a phenol compound, a naphthol compound or a hydroxyanthracene compound substituted by at least one substituent selected from a methylol group, an alkoxymethyl group or an acyloxymethyl group. Among these, polyfunctional epoxy resins are preferable.

The epoxy resin (a) is not particularly limited as long as it has an epoxy group and a crosslinking property, and examples thereof include: a divalent glycidyl group-containing low-molecular weight compound, such as bisphenol A glycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline; a trivalent glycidyl group-containing low-molecular weight compound, such as trimethylolpropane triglycidyl ether, trimethylolphenol triglycidyl ether and TrisP-PA triglycidyl ether; a tetravalent glycidyl group-containing low-molecular weight compound, such as pentaerythritol tetraglycidyl ether and tetramethylolbisphenol A tetraglycidyl ether; a polyvalent glycidyl group-containing low-molecular weight compound, such as dipentaerythritol pentaglycidyl ether and dipentaerythritol hexaglycidyl ether; and a glycidyl group-containing polymer compound, such as polyglycidyl(meth)acrylate and a 1,2-epoxy-4-(2-oxiranyl)cyclohexane adduct of 2,2-bis(hydroxymethyl)-1-butanol.

The number of substitution by a methylol group, an alkoxymethyl group or an acyloxymethyl group in the crosslinking agent (b) is generally from 2 to 6 in the case of a melamine compound, and from 2 to 4 in the case of a glycoluril compound, a guanamine compound and a urea compound; and is preferably from 5 to 6 in the case of a melamine compound and from 3 to 4 in the case of a glycoluril compound, a guanamine compound and a urea compound.

The melamine compound, the guanamine compound, the glycoluril compound and the urea compound (b) are collectively referred to as compound (b) (a methylol group-containing compound, an alkoxymethyl group-containing compound or an acyloxymethyl group-containing compound).

The methylol group-containing compound (b) can be obtained by heating an alkoxymethyl group-containing compound in an alcohol in the presence of an acid catalyst such as hydrochloric acid, sulfuric acid, nitric acid or methanesulfonic acid. The acyloxymethyl group-containing compound (b) can be obtained by mixing and stirring the methylol group-containing compound (b) with an acyl chloride in the presence of a basic catalyst.

Specific examples of the compound (b) having the aforementioned substituent include the following.

Examples of the melamine compound include hexamethylolmelamine, hexamethoxymethylmelamine, a compound in which 1 to 5 methylol groups of hexamethylolmelamine are methoxymethylatied or a mixture thereof, hexamethoxyethylmelamine, hexaacyloxymethylmelamine, and a compound in which 1 to 5 methylol groups of hexamethylolmelamine are acyloxymethlated or a mixture thereof.

Examples of the guanamine compound include tetramethylolguanamine, tetramethoxymethylguanamine, a compound in which 1 to 3 methylol groups of tetramethylolguanamine are methoxymethylated or a mixture thereof, tetramethoxyethylguanamine, tetraacyloxymethylguanamine, and a compound in which 1 to 3 methylol groups of tetramethylolguanamine are acyloxymethylated or a mixture thereof.

Examples of the glycoluril compound include tetramethylolglycoluril, tetramethoxymethylglycoluril, a compound in which 1 to 3 methylol groups of tetramethylolglycoluril are methoxymethylated or a mixture thereof, and a compound in which 1 to 3 methylol groups of tetramethylolglycoluril are acyloxymethylated or a mixture thereof.

Examples of the urea compound include tetramethylolurea, tetramethoxymethylurea, a compound in which 1 to 3 methylol groups of tetramethylolurea are methoxymethylated or a mixture thereof, and tetramethoxyethylurea.

The compound (b) may be used singly or in combination of two or more kinds thereof.

Similar to the crosslinking agent (b), the crosslinking agent (c), i.e., a phenol compound, a naphthol compound or a hydroxyanthracene compound substituted by at least one substituent selected from a methylol group, an alkoxymethyl group or an acyloxymethyl group, suppress intermixing of a film and a photoresist coated thereon by thermal crosslinking and further enhances the film strength. These compounds may be collectively referred to as a compound (c) (a methylol group-containing compound, an alkoxymethyl group-containing compound or an acyloxymethyl group-containing compound).

The number of a methylol group, an alkoxymethyl group or an acyloxymethyl group contained in the crosslinking agent (c) is at least two per molecule, and a compound having a phenol compound as a skeleton in which both the 2-position and the 4-position are substituted is preferable in view of improving thermal crosslinking property and storage stability. In the case of a compound having a naphthol compound skeleton or a hydroxyanthracene compound skeleton, compounds in which all of the o-positions and the p-positions with respect to the OH group are substituted are preferable. The 3-position or the 5-position of the phenol compound may be substituted or unsubstituted.

In the naphthol compound, positions which are other than the o-positions with respect to the OH group may be substituted or unsubstituted.

The methylol group-containing compound (c) can be obtained by using, as a raw material, a compound in which the 2- or 4-position of the phenolic hydroxyl group is a hydrogen atom, and reacting this compound with formalin in the presence of a basic catalyst such as sodium hydroxide, potassium hydroxide, ammonia or tetraalkylammonium hydroxide.

The alkoxymethyl group-containing compound (c) can be obtained by heating the methylol group-containing compound (c) in an alcohol in the presence of an acid catalyst such as hydrochloric acid, sulfuric acid, nitric acid or methanesulfonic acid.

The acyloxymethyl group-containing compound (c) can be obtained by reacting the methylol group-containing compound (c) with an acyl chloride in the presence of a basic catalyst.

Examples of the skeleton compound of the crosslinking agent (c) include a phenol compound, a naphthol compound and a hydroxyanthracene compound, in which the o-positions and the p-positions with respect to the phenolic OH group are not substituted, and examples thereof include phenol, isomers of cresol, 2,3-xylenol, 2,5-xylenol, 3,4-xylenol, 3,5-xylenol, a bisphenol compound such as bisphenol A, 4,4'-bishydroxybiphenyl, TrisP-PA (produced by Honshu Chemical Industry Co., Ltd.), naphthol, dihydroxynaphthalene and 2,7-dihydroxyanthracene.

Specific examples of the crosslinking agent (c) include, as a phenol compound or a naphthol compound, trimethylolphenol, tri(methoxymethyl)phenol, a compound in which 1 to 2 methylol groups of trimethylolphenol are methoxymethylated, trimethylol-3 cresol, tri(methoxymethyl)-3-cresol, a compound in which 1 to 2 methylol groups of trimethylol-3-cresol are methoxymethylated, a dimethylolcresol such as 2,6 dimethylol-4-cresol, tetramethylolbisophenol A, tetramethoxymethylbisphenol A, a compound in which 1 to 3 methylol groups of tetramethylolbisphenol A are methoxymethlated, tetramethylol-4,4'-bishydroxybiphenyl, tetramethoxymethyl-4,4'-bishydroxybiphenyl, a hexamethylol compound of TrisP-A, a hexamethoxymethyl compound of TrisP-PA, a compound in which 1 to 5 methylol groups of a hexamethylol compound of TrisP-PA are methoxymethylated, and bishydroxymethylnaphthalenediol.

Examples of the hydroxyanthracene compound include 1,6-dihydroxymethyl-2,7-dihydroxyanthracene.

Examples of the acyloxymethyl group-containing compound include compounds in which part or all of the methylol groups of a methylol group-containing compound are acyloxymethylated.

Preferable examples among these compounds include trimethylolphenol, bishydroxymethyl-p-cresol, tetramethylolbisphenol A, a hexamethylol compound of TrisP-PA (produced by Honshu Chemical Industry Co., Ltd.), and phenol compounds obtained by substituting the methylol groups of these compounds by an alkoxymethyl group, and both a methylol group and an alkoxymethyl group.

The compound (c) may be used singly or in combination of two or more kinds thereof.

In the invention, it is not essential to include a crosslinking agent. In the case in which a crosslinking agent is used, the total content of the crosslinking agents (a) to (c) in the dye-containing negative curable composition is, although it depends on the type of the materials, preferably from 1 mass % to 70 mass %, more preferably from 5 mass % to 50 mass %, and particularly preferably from 7 mass % to 30 mass %, based on the solid content of the curable composition Heat Polymerization Inhibitor The dye-containing negative curable composition may include, in addition to the above components, a heat polymerization inhibitor. Examples of suitably used heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol) and 2-mercaptobenzimidazole.

Other Additives

Various kinds of additives such as a filler, a polymer compound other than the alkali-soluble binder, a surfactant, an adhesion promotor, an antioxidant, an ultraviolet ray absorbing agent and an aggregation inhibitor may be added to the dye-containing negative curable composition, as necessary.

Examples of the additives include a filler, such as glass and alumina; a polymer compound other than the binder resin, such as polyvinyl alcohol, polyacrylic acid, polyethylene glycol monoalkyl ether and polyfluoroalkyl acrylate; a surfactant, such as a nonionic surfactant, a cationic surfactant and an anionic surfactant; an adhesion promotor, such as vinyltrimethoxysilane, vinyltriethoxysilane, vinyltris(2-methoxyethoxy)silane, N-(2-amonoethyl)-3-aminopropyldimethylmethoxysilane, N-(2-aminoethyl)-3-aminopropyltrimethyoxysilane, 3-aminopropyltriethoxysilane, 3-glycidoxypropyltrimethoxysilane, 3-glycidoxypropylmethyldimethoxysilane, 2-(3,4- epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; an antioxidant, such as 2,2-thiobis(4-methyl-6-t-butylphenol) and 2,6-di-t-butylphenol; an ultraviolet ray absorbing agent, such as 2-(3-t-butyl-5-methyl-2-hydroxyphenyl)-5-chlorobenzotriazole and alkoxybenzophenone; and an aggregation inhibitor such as sodium polyacrylate.

In view of promoting the alkali-solubility of non-exposed portions in order to further improve developability of the dye-containing negative curable composition, an organic carboxylic acid, preferably a low-molecular-weight organic carboxylic acid having a molecular weight of 1,000 or less, may be added to the composition.

Specific examples of the low-molecular-weight organic carboxylic acid having a molecular weight of 1,000 or less include an aliphatic monocarboxylic acid, such as formic acid, acetic acid, propionic acid, butyric acid, valeric acid, pivalic acid, caproic acid, diethylacetic acid, enanthic acid and caprylic acid; an aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; an aliphatic tricarboxylic acid, such as tricarballylic acid, aconitic acid and camphoronic acid; an aromatic monocarboxylic acid, such as benzoic acid, toluic acid, cuminic acid, hemellitic acid and mesitylenic acid; an aromatic polycarboxylic acid, such as phthalic acid, isophthalic acid, terephthalic acid, trimellitic acid, trimesic acid, mellophanic acid and pyromellitic acid; and other carboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

The dye-containing negative curable composition according to the invention is preferably used for forming colored pixels for color filters used in liquid crystal display devices (LCD), solid-state imaging devices (such as CCD and CMOS) and the like.

The dye-containing negative curable composition according to the invention is particularly suitable for color filters used in solid-state image sensors in which formation of a thin film of fine-sized colored pattern with a favorable rectangular profile is required. Specifically, in the case in which the pattern size of a pixel for a color filter (the side length of a pixel pattern when viewed from a direction normal to a substrate) is 2 μm or less (for example, 0.5 μm to 2.0 μm) if a pigment is used, color irregularities may be easily caused due to the presence of coarse particles of the pigment; or if a dye is used, color deletion due to dissolution of the dye into a developer or heat sag may easily occur during heat treatment conducted after patterning, since the amount of components that contribute to photolithographic properties is decreased as a result of increasing the amount of the dye. These problems are particularly significant when the pattern size is from 1.0 μm to 1.7 μm (in particular, from 1.2 μm to 1.5 μm). Moreover, when the film thickness is 1 μm or less, the amount of components that contribute to photolithographic properties is relatively decreased as the amount of a colorant is increased. As a result, resolution is decreased, exfoliation of the pattern in low-exposed regions tends to occur, and heat sag is easily caused during heat treatment after patterning. These problems are particularly significant when the film thickness is from 0.005 μm to 0.9 μm (in particular, from 0.1 μm to 0.7 μm).

When the dye-containing negative curable composition according to the invention is used for forming a color filter for solid-state image sensors, a pattern having a highly rectangular shape may be obtained while suppressed tapering due to heat sag. Further, since a pattern with enhanced sensitivity and improved adhesion to a substrate may be obtained, occurrence of exfoliation of the pattern and image defects caused by the exfoliation may be suppressed.

In particular, when the dye-containing negative curable composition is used in the formation of a color filter for solid-state image sensors, a pattern having a high color density and a highly rectangular shape with suppressed tapering due to heat sag may be obtained even if the thickness of the pattern is as small as 1 μm or less. Further, the thus-obtained pattern may exhibit improved adhesion to a substrate or the like, and occurrence of image defects due to exfoliation of the pattern may be suppressed accordingly.

<Color Filter and Method of Producing the Same>

Next, a color filter according to the invention is described in detail with reference to the method of producing the same.

In the method of producing the color filter according to the invention, the dye-containing negative curable composition as described in the foregoing is used.

By using the dye-containing negative curable composition according to the invention, the obtained color filter exhibits a high color residual ratio after being developed. Further, by using the dye-containing negative curable composition according to the invention, heat resistance can be imparted to the obtained color filter since thermal fluidity of the dye is suppressed due to interaction between the dye and the (D) amino group-containing alkali-soluble resin. As a result, a color filter formed from a fine-sized pattern having a favorable shape and a high resolution, while not being susceptible to deformation due to the effect of heat sag during heat treatment, can be obtained. Moreover, a cured pattern can be formed with favorable sensitivity, its adhesion with respect to a substrate can be increased, whereby a color filter in which occurrence of exfoliation (image defects) is suppressed can be obtained. These effects are particularly significant when the organic solbent-soluble dye is used in the dye-containing negative curable composition at high concentration, and when the (D) amino group-containing alkali-soluble resin is used.

The method of producing a color filter according to the invention includes applying the dye-containing negative curable composition according to the invention onto a support to form a dye-containing negative curable composition layer, exposing the dye-containing negative curable composition layer to light through a mask, and developing the exposed dye-containing negative curable composition layer to form a pattern on the support.

Specifically, the color filter can be suitably produced by applying the dye-containing negative curable composition onto a support by a coating method such as spin coating, flow coating or roll coating to form a dye-containing negative curable composition layer (a radiation-sensitive composition layer), exposing the formed layer via a given mask pattern, and developing the exposed layer with a developer to form a negative color pattern (image formation process). As necessary, a process of curing the formed color pattern by heating and/or further exposing to light may be included in the method.

In the production of a color filter, a color filter composed of intended color hues can be produced by repeating the above image formation process (and, as necessary, the curing process) for the number of times corresponding to the number of intended color hues. Ultraviolet rays such as g-line, h-line and i-line are preferably used as the light or radiation for the exposure.

Exposure of the negative curable composition may be performed by any of proximity exposure, mirror projection exposure or stepper exposure, but it is particularly preferable to perform the exposure by a stepper method (a reduced projection exposure method in which a reduced projection exposure device is used). According to a stepper method, a pattern is formed by performing exposure while gradually changing the exposure amount, and favorable rectangularity of the pattern can be achieved.

Examples of the exposure device used for stepper exposure include an i-line stepper (trade name: FPA-3000i5+; manufactured by Canon Inc.)

Examples of the support include soda glass, borosilicate glass (such as PYREX (registered trademark) glass) and silica glass and the like with a transparent conductive film formed thereon, which are used in liquid crystal display elements and the like; photoelectrical conversion element substrates used in image sensors and the like, such as a silicon substrate; and complementary metal oxide film semiconductors (CMOS). Black stripes may be formed on these supports in order to define the pixels from each other.

Further, an undercoating layer may be provided on these supports, as necessary, for the purpose of improving adhesiveness with respect to the upper layer, preventing diffusion of substances, or smoothing the substrate surface.

Any developer may be used as long as it dissolves uncured portions of the negative curable composition but does not dissolve exposed portions. Specifically, a combination of various kinds of organic solvents or an alkali aqueous solutions may be used. Examples of the organic solvents include the organic solvents as described above that can be used in preparing the dye-containing negative curable composition according to the invention.

Preferable examples of the alkali aqueous solution include alkali aqueous solutions formed by dissolving an alkali compound such as sodium hydroxide, potassium hydroxide, sodium carbonate, sodium silicate, sodium metasilicate, ammonia water, ethylamine, diethylamine, dimethyl ethanol amine, tetramethyl ammonium hydroxide, tetraethyl ammonium hydroxide, choline, pyrrole, piperidine and 1,8-diazabi-cyclo-[5.4.0]-7-undecene to a concentration of from 0.001 mass % to 10 mass %, preferably from 0.01 mass % to 1 mass %.

When a developer formed from this kind of alkali aqueous solution is used, washing with water is generally performed after the development.

The color filter can be used in liquid crystal display elements or solid state image sensors such as CCD devices and, in particular, is favorably used in high-resolution CCD devices, CMOS devices and the like having more than one million pixels.

The color filter according to the invention may be used, for example, as a color filter disposed between the light receiving portion of each pixel that forms a CCD and a microlens for focusing light.

The color filter according to the invention may have a colored pattern that exhibits favorable rectangularity due to the use of the dye-containing negative curable composition according to the invention. Accordingly, a solid-state image sensor provided with this color filter may exhibit excellent color reproducibility.

The configuration of the solid-state image sensor is not particularly limited as long as the solid-state image sensor is provided with the color filter according to the invention and functions as a solid-state image sensor. One example of the configuration of the solid-state image sensor includes, on a support, plural photodiodes that constitute a light-receiving area of the CCD image sensor and a transfer electrode formed from polysilicone or the like; a light-shielding film formed from tungsten or the like, having an opening at a position corresponding to the light-receiving area of the photodiodes; and a device protection film formed from silicon nitride or the like, formed so as to cover the whole area of the light-shielding film and the light-receiving area of the photodiodes; and the color filter according to the invention formed on the device protection film.

It is also applicable to provide a light-harvesting means (such as a microlens) between the device protection film and the color filter (at a position closer to the support) or on the top of the color filter.

EXAMPLES

In the following, the invention is explained in further detail using the Examples. However, the invention is not limited to the following Examples. Unless otherwise indicated, "parts" and "percent" refer to the mass standard.

Synthesis of (D) Amino Group-Containing Alkali-Soluble Resin

Synthesis Example 1

Synthesis of Specific Polymer Compound P-1

7.0 g of monomer A-1 represented by Formula (3), 77.0 g of benzyl methacrylate, 16.0 g of methacrylic acid, and 150.0 g of 1-methoxy-2-propanol were introduced into a nitrogen-substituted three-necked flask, and stirred by a stirrer (THREE-ONE MOTOR, manufactured by Shinto Scientific Co., Ltd.) and heated to 80° C. while allowing nitrogen to flow through the inside of the flask. 4.61 g of 2,2-azobis(2,4-dimethylvaleronitrile (V-65, manufactured by Wako Pure Chemical Industries Ltd.) were added thereto and stirred while heating at 80° C. for 2 hours. 2 hours after, 4.61 g of V-65 were further added and stirred while heating for 3 hours, thereby obtaining a 40 mass % solution of a specific polymer compound P-1.

Gel permeation chromatography (GPC) using polystyrene as a standard material indicated that the specific polymer compound P-1 had a weight average molecular weight of 15,000. Titration using sodium hydroxide indicated that the specific polymer compound P-1 had an acid value with respect to its solid content of 102 mgKOH/g, and titration using hydrochloric acid indicated that the specific polymer compound P-1 had an amino value with respect to its solid content of 26 mgKOH/g.

Synthesis Example 2

40 mass % solutions of specific polymer compounds P-2 to P-19 were obtained in a substantially similar manner to Synthesis Example 1, except that the kinds and amounts of the monomers used in Synthesis Example 1 were changed as shown in the following Table 1. The thus-obtained specific polymer compounds were subjected to measurements of weight average molecular weight and the like in a substantially similar manner to Synthesis Example 1, and the results are shown in Table 1.

Synthesis Example 3

40 mass % solutions of polymer compounds C-1 and C-2 were obtained in a substantially similar manner to Synthesis Example 1, except that the kinds and amounts of the monomers used in Synthesis Example 1 were changed as shown in the following Table 1. The thus-obtained polymer compounds were subjected to measurements of weight average molecular weight and the like in a substantially similar manner to Synthesis Example 1, and the results are shown in Table 1.

TABLE 1

| Specific polymer compound No. | Formulation of Specific polymer compound (wt %) | | | Weight average molecular weight | Acid value (mgKOH/g) | Amino value (mgKOH/g) |
|---|---|---|---|---|---|---|
| P-1  | A-1 7   | BzMA 77 | MAA 16  | 15,000 | 102 | 26  |
| P-2  | A-2 12  | BzMA 72 | MAA 16  | 14,000 | 101 | 35  |
| P-3  | A-4 10  | BzMA 75 | MAA 15  | 17,000 | 98  | 24  |
| P-4  | A-9 15  | BzMA 75 | MAA 15  | 13,000 | 95  | 41  |
| P-5  | A-11 15 | BzMA 75 | MAA 15  | 19,000 | 97  | 31  |
| P-6  | A-15 10 | BzMA 75 | MAA 15  | 16,000 | 97  | 17  |
| P-7  | A-16 10 | BzMA 75 | MAA 15  | 16,000 | 96  | 18  |
| P-8  | A-18 10 | BzMA 74 | MAA 16  | 18,000 | 102 | 31  |
| P-9  | A-1 10  | St 75   | MAA 15  | 19,000 | 97  | 35  |
| P-10 | A-1 10  | MMA 75  | MAA 15  | 18,000 | 98  | 34  |
| P-11 | A-15 3  | BzMA 85 | MAA 12  | 17,000 | 76  | 6   |
| P-12 | A-1 70  | BzMA 20 | MAA 10  | 16,000 | 64  | 250 |
| P-13 | A-23 7  | BzMA 78 | MAA 15  | 18,000 | 97  | 30  |
| P-14 | A-24 10 | BzMA 75 | MAA 15  | 17,000 | 96  | 29  |
| P-15 | A-25 15 | BzMA 70 | MAA 15  | 16,000 | 97  | 28  |
| P-16 | A-26 25 | BzMA 15 | MAA 40  | 19,000 | 95  | 29  |
| P-17 | A-1 7   | BzMA 77 | MMA 16  | 17,000 | 0   | 27  |
| P-18 | A-1 10  | BzMA 50 | MAA 40  | 18,000 | 258 | 33  |
| P-19 | A-1 7   | BzMA 77 | MAA 16  | 43,000 | 104 | 27  |
| C-1  | MMA 10  | BzMA 75 | MAA 15  | 16,000 | 97  | —   |
| C-2  | BzMA 85 | MAA 15  | —       | 17,000 | 96  | —   |

BzMA: benzyl methacrylate
MAA: methacrylic acid
St: styrene
MMA: methyl methacrylate Example 1

1) Preparation of Dye-Containing Negative Curable Composition

The following compounds were mixed and dissolved according to the formulation indicated below, and the dye-containing negative curable composition of the present invention was prepared.

Formulation:

(E) Organic solvent (cyclohexanone) 26 g (A) Organic solvent-soluble acidic dye (Varifast Yellow 1101) 4.0 g (B) Photo-polymerization initiator (oxime A, shown below) 1.0 g (C) Polymerizable monomer (monomer A, shown below) 3.0 g (D) Amino group-containing alkali-soluble resin (specific polymer compound P-1) (shown above) 2.0 g 2) Production of Silicone Wafer Substrate Having Undercoat Layer A resist solution (CT-2000L; manufactured by FUJIFILM ELECTRONIC MATERIALS CO., LTD.) was applied onto a silicon wafer substrate to a thickness of 0.1 µm using a spin coater, and dried by heating at 220° C. for 1 hour to form a cured film (undercoat layer).

3) Exposure and Development of Dye-Containing Negative Curable Composition (Pattern Formation Process)

The dye-containing negative curable composition obtained in 1) above was applied onto the undercoat layer formed on the silicon substrate obtained in 2) above, such that the film thickness was 1 µm using a spin coater, and the film was pre-baked at 100° C. for 120 seconds.

Then, the film was exposed to light having a wavelength of 365 nm through a mask with a size of 2 µm×2 µm using an i-line contraction projection exposure device, while changing an exposure amount. After the exposure, the images formed were developed at 23° C. for 60 seconds using a developer (CD-2060, manufactured by FUJIFILM ELECTRONICS MATERIALS CO., LTD.). This was then rinsed with running water for 20 seconds and spin-dried, thereby obtaining a color filter on which a pattern image was formed.

The shape of the pattern was observed by an ordinary method using an optical microscope and SEM photography. The exposure amount at which the ratio of the width of a pixel pattern having a size of 2 μm×2 μm to the width of a space between the pixel patterns was 1:1 was determined as an appropriate exposure amount.

Examples 2-49

Dye-containing negative curable compositions were prepared and evaluated in a similar manner to Example 1, except that formulations of the respective dye-containing negative curable compositions were changed as shown in the following Tables 2 and 3.

Comparative Examples 1-15

Dye-containing negative curable compositions were prepared and evaluated in a similar manner to Example 1, except that formulations of the respective dye-containing negative curable compositions were changed as shown in the following Table 4.

4) Evaluations (1) Development Color Residual Ratio

Light absorbencies of the film were measured at before and after the development in 3) above, and the development color residual ratio was calculated by the following expression and evaluated.

Development color residual ratio (%)=[(light absorbency of film after development)/(light absorbency of film before development)]×100

(2) Profile

The pixel pattern image formed at an appropriate exposure amount as defined in 3) above was subjected to post-baking at 200° C. for 300 seconds. A cross-section of the pixel pattern image after post-baking was observed using an SEM and evaluated in accordance with the following criteria. The cross-section of a pattern refers to a cross-section cut by a plane that is normal to the silicon substrate and parallel to one side of the pattern. The results are shown in Tables 2 to 4.

Evaluation Criteria

A: The pattern profile has a favorable rectangular shape, as shown in FIG. 1(A).

B: The pattern profile is acceptable in practical use, although the corners that do not contact the substrate are slightly round, as shown in FIG. 1(B).

C: The pattern profile has a round-top shape in which the corners that do not contact the substrate are round, as shown in FIG. 1(C).

D: The pattern profile has a shape with a round-top and a broad bottom, as shown in FIG. 1(D).

E: The pattern profile has a completely round-top shape, as shown in FIG. 1(E).

(3) Residue

The presence or absence of development residues in non-image portions (unexposed portions) of a pixel pattern, which was formed at an appropriate exposure amount as defined in 3) above and developed, was observed by using an image of the pixel pattern formed by a scanning electron microscope (SEM).

Evaluation Criteria

A: No development residues are observed.

B: No development residues are observed, although a trace amount of the same is observed at a boundary between an image portion (exposed portion) and a non-image portion (unexposed portion).

C: A trace amount of development residues is observed at a non-image portion (unexposed portion).

D: Dot-shaped development residues are clearly observed at a non-image portion (unexposed portion).

E: Development residues remain in the form of a residue film at a non-image portion (unexposed portion) such that the substrate surface was not seen.

(4) In-Plane Uniformity of Coating Film

The dye-containing negative curable compositions obtained in the Examples and the Comparative Examples were applied on an 8-inch wafer to form a film having a thickness of 1.0 μm using a spin coater, and subjected to pre-baking at 100° C. for 120 seconds. Thereafter, the thickness of the film was measured at randomly selected 12 points within the film plane, and the maximum deviation from the average thickness was calculated. The smaller the value of deviation is, the more favorable the uniformity is.

The film thickness can be measured by either a contact type film thickness meter or a non-contact type film thickness meter. In the Examples, a contact type profilometer (DEK-TAK6, manufactured by Veeco Instruments) was used for measuring a distance between the wafer and the surface of the film after scraping off the film from the wafer. The results are shown in Tables 2 to 4.

Film Thickness Measurement Conditions
Load: 10 mg
Measurement Speed: M-Range

TABLE 2

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Example 1 | Varifast Yellow 1101 (40 wt %) | Oxime A (10 wt %) | Monomer A (30 wt %) | P-1 (20 wt %) | Cyclo-hexanone | 95% | A | A | 0.04 |
| Example 2 | same as above | same as above | same as above | P-4 (20 wt %) | same as above | 97% | A | B | 0.03 |
| Example 3 | same as above | same as above | same as above | P-5 (20 wt %) | same as above | 92% | A | B | 0.04 |
| Example 4 | same as above | same as above | same as above | P-9 (20 wt %) | same as above | 92% | B | B | 0.05 |
| Example 5 | same as above | same as above | same as above | P-10 (20 wt %) | same as above | 97% | A | A | 0.05 |
| Example 6 | Varifast Yellow 1101 (40 wt %) | Oxime A (10 wt %) | Monomer B (30 wt %) | P-1 (20 wt %) | same as above | 95% | A | A | 0.02 |

TABLE 2-continued

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Example 7 | same as above | same as above | same as above | P-4 (20 wt %) | same as above | 95% | A | B | 0.02 |
| Example 8 | same as above | same as above | same as above | P-5 (20 wt %) | same as above | 92% | A | B | 0.03 |
| Example 9 | same as above | same as above | same as above | P-9 (20 wt %) | same as above | 90% | B | B | 0.04 |
| Example 10 | same as above | same as above | same as above | P-10 (20 wt %) | same as above | 97% | A | A | 0.04 |
| Example 11 | Varifast Yellow 1101 (40 wt %) | Oxime A (10 wt %) | Monomer C (30 wt %) | P-1 (20 wt %) | same as above | 95% | A | A | 0.04 |
| Example 12 | same as above | same as above | same as above | P-4 (20 wt %) | same as above | 95% | A | B | 0.04 |
| Example 13 | same as above | same as above | same as above | P-5 (20 wt %) | same as above | 92% | A | B | 0.05 |
| Example 14 | same as above | same as above | same as above | P-9 (20 wt %) | same as above | 92% | B | B | 0.04 |
| Example 15 | same as above | same as above | same as above | P-10 (20 wt %) | same as above | 95% | A | A | 0.04 |
| Example 16 | Varifast Yellow 1101 (50 wt %) | Oxime A (7 wt %) | Monomer A (20 wt %) | P-1 (20 wt %) | Cyclo-hexanone | 92% | A | A | 0.06 |
| Example 17 | same as above | same as above | same as above | P-2 (20 wt %) | same as above | 95% | A | A | 0.05 |
| Example 18 | same as above | same as above | same as above | P-3 (20 wt %) | same as above | 90% | A | B | 0.07 |
| Example 19 | same as above | same as above | same as above | P-4 (20 wt %) | same as above | 92% | B | A | 0.07 |
| Example 20 | same as above | same as above | same as above | P-5 (20 wt %) | same as above | 95% | A | B | 0.05 |
| Example 21 | same as above | same as above | same as above | P-6 (20 wt %) | same as above | 90% | B | B | 0.06 |
| Example 22 | same as above | same as above | same as above | P-7 (20 wt %) | same as above | 90% | B | B | 0.06 |
| Example 23 | same as above | same as above | same as above | P-8 (20 wt %) | same as above | 95% | A | B | 0.08 |
| Example 24 | same as above | same as above | same as above | P-9 (20 wt %) | same as above | 90% | B | B | 0.05 |
| Example 25 | same as above | same as above | same as above | P-10 (20 wt %) | same as above | 95% | A | A | 0.06 |

TABLE 3

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Example 26 | Varifast Yellow 1101 (50 wt %) | Oxime A (7 wt %) | Monomer A (20 wt %) | P-11 (20 wt %) | Cyclo-hexanone | 90% | B | B | 0.05 |
| Example 27 | same as above | same as above | same as above | P-12 (20 wt %) | same as above | 90% | B | B | 0.06 |
| Example 28 | same as above | same as above | same as above | P-13 (20 wt %) | same as above | 90% | A | B | 0.08 |
| Example 29 | same as above | same as above | same as above | P-14 (20 wt %) | same as above | 90% | A | B | 0.07 |
| Example 30 | same as above | same as above | same as above | P-15 (20 wt %) | same as above | 90% | A | B | 0.06 |
| Example 31 | same as above | same as above | same as above | P-16 (20 wt %) | same as above | 92% | A | B | 0.06 |
| Example 32 | same as above | same as above | same as above | P-17 (20 wt %) | same as above | 90% | B | B | 0.05 |
| Example 33 | same as above | same as above | same as above | P-18 (20 wt %) | same as above | 90% | A | B | 0.06 |
| Example 34 | same as above | same as above | same as above | P-19 (20 wt %) | same as above | 90% | B | B | 0.06 |
| Example 35 | Varifast Yellow 1101 (60 wt %) | Oxime A (5 wt %) | Monomer A (15 wt %) | P-1 (20 wt %) | same as above | 92% | A | A | 0.06 |
| Example 36 | same as above | same as above | same as above | P-4 (20 wt %) | same as above | 92% | A | B | 0.06 |

TABLE 3-continued

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Example 37 | same as above | same as above | same as above | P-5 (20 wt %) | same as above | 88% | A | B | 0.08 |
| Example 38 | same as above | same as above | same as above | P-9 (20 wt %) | same as above | 88% | B | B | 0.07 |
| Example 39 | same as above | same as above | same as above | P-11 (20 wt %) | same as above | 92% | A | A | 0.08 |
| Example 40 | Varifast Yellow 1101 (30 wt %) Acid Red (30 wt %) | Oxime A (5 wt %) | Monomer A (15 wt %) | P-1 (20 wt %) | same as above | 92% | A | A | 0.07 |
| Example 41 | same as above | same as above | same as above | P-4 (20 wt %) | same as above | 92% | B | B | 0.06 |
| Example 42 | same as above | same as above | same as above | P-5 (20 wt %) | same as above | 88% | A | B | 0.08 |
| Example 43 | same as above | same as above | same as above | P-9 (20 wt %) | same as above | 88% | B | B | 0.08 |
| Example 44 | same as above | same as above | same as above | P-11 (20 wt %) | same as above | 94% | A | A | 0.08 |
| Example 45 | Varifast Yellow 1101 (30 wt %) Acid Red 57 (30 wt %) | Oxime B (5 wt %) | Monomer A (15 wt %) | P-1 (20 wt %) | same as above | 90% | A | A | 0.07 |
| Example 46 | same as above | same as above | same as above | P-4 (20 wt %) | same as above | 92% | B | B | 0.07 |
| Example 47 | same as above | same as above | same as above | P-5 (20 wt %) | same as above | 92% | A | B | 0.08 |
| Example 48 | same as above | same as above | same as above | P-9 (20 wt %) | same as above | 92% | B | B | 0.07 |
| Example 49 | same as above | same as above | same as above | P-11 (20 wt %) | same as above | 90% | A | A | 0.09 |

TABLE 4

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Comparative example 1 | Varifast Yellow 1101 (40 wt %) | Oxime A (15 wt %) | Monomer A (45 wt %) | — | Cyclo-hexanone | 88% | D | B | 0.18 |
| Comparative example 2 | same as above | same as above | Monomer B (45 wt %) | — | same as above | 80% | C | B | 0.16 |
| Comparative example 3 | same as above | same as above | Monomer C (45 wt %) | — | same as above | 84% | D | B | 0.18 |
| Comparative example 4 | same as above | Oxime A (10 wt %) | Monomer A (30 wt %) | C-1 (20 wt %) | same as above | 76% | C | B | 0.16 |
| Comparative example 5 | same as above | same as above | Monomer B (30 wt %) | C-1 (20 wt %) | same as above | 76% | C | B | 0.13 |
| Comparative example 6 | same as above | same as above | Monomer C (30 wt %) | C-1 (20 wt %) | same as above | 72% | C | B | 0.16 |
| Comparative example 7 | Varifast Yellow 1101 (50 wt %) | Oxime A (7 wt %) | Monomer A (20 wt %) | — | same as above | 72% | D | D | 0.25 |
| Comparative example 8 | same as above | same as above | same as above | C-1 (20 wt %) | same as above | 70% | D | D | 0.22 |
| Comparative example 9 | same as above | same as above | same as above | C-2 (20 wt %) | same as above | 70% | D | D | 0.20 |
| Comparative example 10 | Varifast Yellow 1101 (60 wt %) | Oxime A (5 wt %) | Monomer A (15 wt %) | — | same as above | 70% | E | E | 0.28 |
| Comparative example 11 | same as above | same as above | same as above | C-1 (20 wt %) | same as above | 62% | E | E | 0.26 |
| Comparative example 12 | same as above | same as above | same as above | C-2 (20 wt %) | same as above | 64% | E | E | 0.26 |
| Comparative example 13 | Varifast Yellow 1101 (30 wt %) Acid red 57 (30 wt %) | Oxime B (5 wt %) | Monomer A (15 wt %) | — | same as above | 62% | E | E | 0.26 |

TABLE 4-continued

| | (A) Organic solvent-soluble dye | (B) Photo-polymerization initiator | (C) Photo-polymerizable compound | (D) Amino group-containing alkali-soluble resin | (E) Organic solvent | Development color residual ratio | Profile | Residue | In-plane uniformity of coating film (Δμm) |
|---|---|---|---|---|---|---|---|---|---|
| Comparative example 14 | same as above | same as above | same as above | C-1 (20 wt %) | same as above | 60% | E | E | 0.24 |
| Comparative example 15 | same as above | same as above | same as above | C-2 (20 wt %) | same as above | 60% | E | E | 0.24 |

Details of the formulations shown in Tables 2 to 4 are as follows.

Oxime A: 2-(O-benzoyloxime)-1-[4-(phenylthio)phenyl]-1,2-octanedione (manufactured by BASF Japan, Ltd.)

Oxime B: 1-(O-acetyloxime)-1-[9-ethyl-6-(2-methylbenzoyl)-9H-carbazol-3-yl]ethanone (manufactured by BASF Japan, Ltd.)

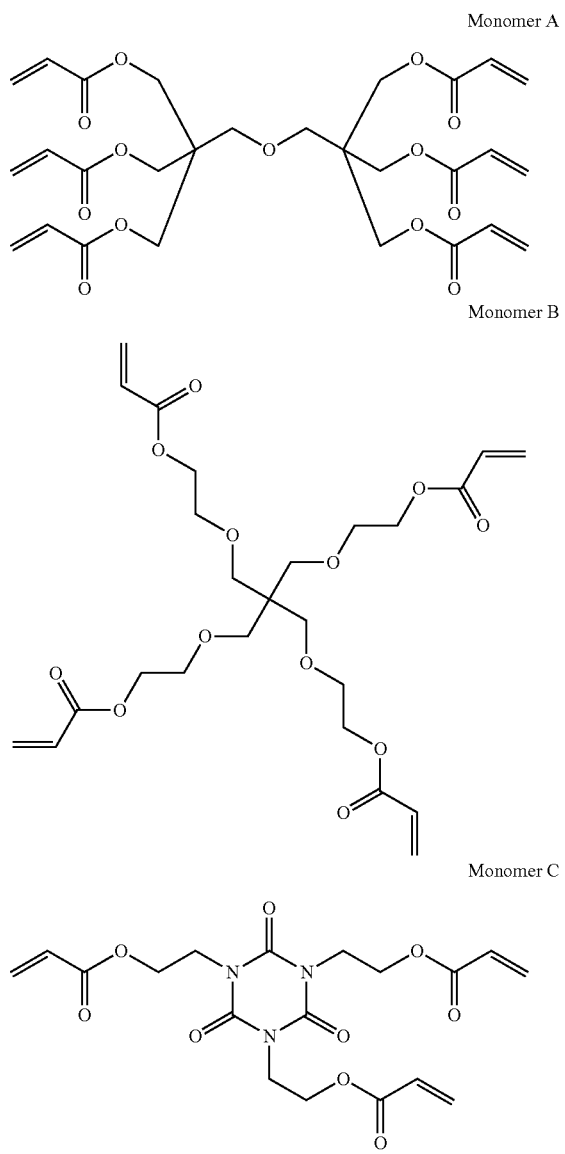

As shown in Tables 2 to 4, the Comparative Examples, in which a dye-containing negative curable composition that does not have the configuration of the invention was used, exhibited unfavorable results in both pattern profile and in-plane uniformity (coating properties) of the coating film.

On the other hand, it was proved that the Examples, in which a dye-containing negative curable composition that has the configuration of the invention was used, exhibited favorable results in both pattern profile and in-plane uniformity (coating properties) of the coating film.

The invention claimed is:

1. A dye-containing negative curable composition comprising at least: (A) an organic solvent-soluble dye; (B) a photo-polymerization initiator; (C) a polymerizable compound; (D) an amino group-containing alkali-soluble resin which is a polymer compound having a repeating unit represented by the following Formula (2); and (E) an organic solvent:

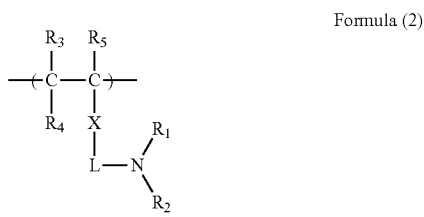

Formula (2)

wherein in Formula (2), each of $R_1$ and $R_2$ represents a hydrogen atom, an alkyl group, an alkenyl group, an alkynyl group, an aryl group or a heterocyclic group, each of which may have a substituent; $R_3$, $R_4$ and $R_5$ each independently represents a hydrogen atom or a monovalent organic group; X represents a phenylene group, *—C(=O)—O— or *—C(=O)—$NR_6$—, in which $R_6$ represents a hydrogen atom or a monovalent organic group, and * represents a site at which X bonds to the main chain of (D) the amino group-containing alkali-soluble resin; and L represents a substituted or unsubstituted alkylene group;

wherein the amino group-containing alkali-soluble resin (D) further comprises a structural unit derived from a monomer having an acidic group; and the content of the amino group-containing alkali-soluble resin (D) is from 10/100 to 50/100 in terms of mass ratio of the amino group-containing alkali-soluble resin (D)/the organic solvent-soluble dye (A).

2. The dye-containing negative curable composition of claim 1, wherein the amino group-containing alkali-soluble resin (D) has a weight-average molecular weight of from 3,000 to 100,000 and an acid value of from 10 mgKOH/g to 200 mgKOH/g.

3. The dye-containing negative curable composition of claim 1, wherein the amino group-containing alkali-soluble resin (D) has an amino value of from 5 mgKOH/g to 200 mgKOH/g.

4. The dye-containing negative curable composition of claim 1, wherein the amino group-containing alkali-soluble resin (D) has an acid value of from 30 mgKOH/g to 200 mgKOH/g.

5. The dye-containing negative curable composition of claim 1, wherein the organic solvent-soluble dye (A) is an acidic dye.

6. The dye-containing negative curable composition of claim 1, wherein the content of the organic solvent-soluble dye (A) is 40 mass % or more with respect to the total solid components of the dye-containing negative curable composition.

7. The dye-containing negative curable composition of claim 1, wherein the photo-polymerization initiator (B) is an oxime compound.

8. The dye-containing negative curable composition of claim 1 used for producing a color filter for a solid-state imaging device.

9. A color filter produced by using the dye-containing negative curable composition of claim 1.

10. A method of producing a color filter, the method comprising:
applying the dye-containing negative curable composition of claim 1 onto a support to form a dye-containing negative curable composition layer; and
forming a pattern on the support by exposing the dye-containing negative curable composition layer to light through a mask and developing the exposed dye-containing negative curable composition layer.

11. A solid-state imaging device comprising the color filter of claim 9.

12. The dye-containing negative curable composition of claim 1, wherein in Formula (2), X represents *—C(=O)—O—.

13. The dye-containing negative curable composition of claim 1, wherein in Formula (2), each of $R_3$ and $R_4$ represents a hydrogen atom and $R_5$ represents a hydrogen atom or a methyl group.

14. The dye-containing negative curable composition of claim 1, wherein in Formula (2), each of $R_1$ and $R_2$ represents an alkyl group.

15. The dye-containing negative curable composition of claim 1, wherein the acid value of the amino group-containing alkali-soluble resin (D) is from 50 mgKOH/g to 180 mgKOH/g.

16. The dye-containing negative curable composition of claim 1, wherein in Formula (2), X represents *—C(=O)—O—; each of $R_1$ and $R_2$ represents an alkyl group, each of $R_3$ and $R_4$ represents a hydrogen atom; $R_5$ represents a hydrogen atom or a methyl group; and the acid value of the amino group-containing alkali-soluble resin (D) is from 50 mgKOH/g to 180 mgKOH/g.

17. The dye-containing negative curable composition of claim 1, wherein the photo-polymerization initiator (B) comprises 2-(O-benzoyloxime)-1-[4-(phenylthio)phenyl]-1,2-octanedione or 1-(O-acetyloxime)-1-[9-ethyl-6-(2-methylbenzoyl)-9H-carbozol-3-yl]ethanone.

* * * * *